United States Patent
Ito et al.

(10) Patent No.: US 8,815,493 B2
(45) Date of Patent: Aug. 26, 2014

(54) RESIST PATTERN-FORMING METHOD, AND RADIATION-SENSITIVE RESIN COMPOSITION

(71) Applicant: JSR Corporation, Tokyo (JP)

(72) Inventors: Koji Ito, Tokyo (JP); Hirokazu Sakakibara, Tokyo (JP); Masafumi Hori, Tokyo (JP); Taiichi Furukawa, Tokyo (JP)

(73) Assignee: JSR Corporation, Tokyo (JP)

(*) Notice: Subject to any disclaimer, the term of this patent is extended or adjusted under 35 U.S.C. 154(b) by 0 days.

(21) Appl. No.: 13/866,087

(22) Filed: Apr. 19, 2013

(65) Prior Publication Data

US 2013/0230803 A1 Sep. 5, 2013

Related U.S. Application Data

(63) Continuation of application No. PCT/JP2011/073356, filed on Oct. 11, 2011.

(30) Foreign Application Priority Data

Oct. 19, 2010 (JP) .................... 2010-234989

(51) Int. Cl.
G03F 7/004 (2006.01)
G03F 7/20 (2006.01)
G03F 7/40 (2006.01)
G03F 7/039 (2006.01)
G03F 7/32 (2006.01)

(52) U.S. Cl.
CPC .............. *G03F 7/004* (2013.01); *G03F 7/0046* (2013.01); *G03F 7/0048* (2013.01); *G03F 7/0397* (2013.01); *G03F 7/2041* (2013.01); *G03F 7/325* (2013.01); *G03F 7/20* (2013.01)
USPC ........ 430/270.1; 430/322; 430/352; 430/329; 430/434; 430/435; 430/331

(58) Field of Classification Search
USPC .............. 430/270.1, 331, 322, 325, 329, 434, 430/435
See application file for complete search history.

(56) References Cited

U.S. PATENT DOCUMENTS

| | | | |
|---|---|---|---|
| 4,910,122 A | 3/1990 | Arnold et al. | |
| 7,998,655 B2 * | 8/2011 | Tsubaki | 430/270.1 |
| 8,017,298 B2 * | 9/2011 | Tsubaki | 430/270.1 |
| 8,017,304 B2 * | 9/2011 | Tarutani et al. | 430/270.1 |
| 8,071,272 B2 * | 12/2011 | Tsubaki | 430/270.1 |
| 8,080,363 B2 * | 12/2011 | Kanda | 430/270.1 |
| 8,088,557 B2 * | 1/2012 | Tsubaki | 430/270.1 |
| 8,227,183 B2 * | 7/2012 | Tsubaki et al. | 430/434 |
| 8,241,840 B2 * | 8/2012 | Tsubaki et al. | 430/325 |
| 8,257,911 B2 * | 9/2012 | Gronheid et al. | 430/325 |
| 8,394,578 B2 * | 3/2013 | Hirano et al. | 430/322 |
| 8,476,001 B2 * | 7/2013 | Tsubaki | 430/322 |
| 8,530,148 B2 * | 9/2013 | Tsubaki et al. | 430/434 |

FOREIGN PATENT DOCUMENTS

| | | |
|---|---|---|
| JP | 06-12452 B2 | 5/1984 |
| JP | 59-93448 | 5/1984 |
| JP | 05-188598 | 7/1993 |
| JP | 2000-199953 | 7/2000 |
| JP | 2005-221721 | 8/2005 |
| JP | 2005-352384 | 12/2005 |
| JP | 2009-025723 | 2/2009 |
| JP | 2009-244780 | 10/2009 |
| JP | 2010-020284 | 1/2010 |
| JP | 2010-134106 | 6/2010 |
| JP | 2010-197619 | 9/2010 |
| WO | WO 2004/068242 | 8/2004 |
| WO | WO 2007/116664 | 10/2007 |

OTHER PUBLICATIONS

Japanese Office Action for corresponding JP Application No. 2012-518672, May 29, 2012.
Japanese Office Action for corresponding JP Application No. 2012-518672, Nov. 13, 2012.
International Search Report for corresponding International Application No. PCT/JP2011/073356, Nov. 8, 2011.
Korean Office Action for corresponding KR Application No. 10-2013-7009902, Sep. 3, 2013.
Korean Office Action for corresponding KR Application No. 10-2013-7009902, Dec. 27, 2013.

\* cited by examiner

*Primary Examiner* — Amanda C Walke
(74) *Attorney, Agent, or Firm* — Ditthavong & Steiner, P.C.

(57) ABSTRACT

A resist pattern-forming method includes coating a radiation-sensitive resin composition on a substrate to provide a resist film. The resist film is exposed. The exposed resist film is developed with a developer solution including no less than 80% by mass of an organic solvent. The radiation-sensitive resin composition includes a base polymer, a fluorine-atom-containing polymer, a radiation-sensitive acid generator, a solvent, and a compound. The base polymer has an acid-labile group. The fluorine-atom-containing polymer has a content of fluorine atoms higher than a content of fluorine atoms of the base polymer. The compound has a relative permittivity greater than a relative permittivity of the solvent by at least 15. A content of the compound is no less than 10 parts by mass and no greater than 200 parts by mass with respect to 100 parts by mass of the base polymer.

5 Claims, No Drawings

RESIST PATTERN-FORMING METHOD, AND RADIATION-SENSITIVE RESIN COMPOSITION

CROSS-REFERENCE TO RELATED APPLICATIONS

The present application is a continuation application of International Application No. PCT/JP2011/073356, filed Oct. 11, 2011, which claims priority to Japanese Patent Application No. 2010-234989, filed Oct. 19, 2010. The contents of these applications are incorporated herein by reference in their entirety.

BACKGROUND OF THE INVENTION

1. Field of the Invention

The present invention relates to a resist pattern-forming method, and a radiation-sensitive resin composition.

2. Discussion of the Background

Miniaturization of various types of electronic device structures such as semiconductor devices and liquid crystal devices has been accompanied by demands for miniaturization of resist patterns in lithography processes. Although fine resist patterns having a line width of about 90 nm can be formed using, for example, an ArF excimer laser at present, finer resist pattern formation is required in the future.

On the other hand, high resolving abilities can be reportedly attained according to liquid immersion lithography, even if a light source of the same exposure wavelength is employed, similarly to the case in which a light source of a shorter wavelength is employed in conventional resist pattern formation. Thus, the liquid immersion lithography has drawn attention as a technique that achieves high resolution in manufacturing semiconductor elements which require a large amount of investment in equipment while suppressing an increase in costs.

However, due to elution of substances included in a resist into a liquid immersion medium, and the like in liquid immersion lithography, disadvantages have been presumed that adversely affect lithography characteristics by way of: deterioration of the resist film to impair performances thereof; regional changes of a refractive index of the liquid immersion medium due to eluted substances; contamination of the surface of a lens from eluted substances; and the like (see pamphlet of PCT International Publication No. 2004/068242). In order to avoid the disadvantages, it has been suggested to increase hydrophobicity of a resist film; however, this modification requires an alteration of a resist composition, and such changes commonly tend to deteriorate lithography characteristics.

In addition, as a technique for increasing resolving power utilizing characteristic features of chemically amplified type resist materials, a technique in which a developer solution is used which is an organic solvent having lower polarity than that of aqueous alkali solutions has been disclosed (see Japanese Unexamined Patent Application, Publication No. 2000-199953).

SUMMARY OF THE INVENTION

According to one aspect of the present invention, a resist pattern-forming method includes coating a radiation-sensitive resin composition on a substrate to provide a resist film. The resist film is exposed. The exposed resist film is developed with a developer solution including no less than 80% by mass of an organic solvent. The radiation-sensitive resin composition includes a base polymer, a fluorine-atom-containing polymer, a radiation-sensitive acid generator, a solvent, and a compound. The base polymer has an acid-labile group. The fluorine-atom-containing polymer has a content of fluorine atoms higher than a content of fluorine atoms of the base polymer. The compound has a relative permittivity greater than a relative permittivity of the solvent by at least 15. A content of the compound is no less than 10 parts by mass and no greater than 200 parts by mass with respect to 100 parts by mass of the base polymer.

According to another aspect of the present invention, a radiation-sensitive resin composition includes a base polymer, a fluorine-atom-containing polymer, a radiation-sensitive acid generator, a solvent, and a compound. The base polymer has an acid-labile group. The fluorine-atom-containing polymer has a content of fluorine atoms higher than a content of fluorine atoms of the base polymer. The compound has a relative permittivity greater than a relative permittivity of the solvent by at least 15. A content of the compound is no less than 10 parts by mass and no greater than 200 parts by mass with respect to 100 parts by mass of the base polymer. The radiation-sensitive resin composition is for use in a resist pattern-forming method including using a developer solution containing no less than 80% by mass of an organic solvent.

DESCRIPTION OF THE EMBODIMENTS

According to an embodiment of the invention made for the purpose of solving the problems, a resist pattern-forming method includes the steps of:

(1) coating a radiation-sensitive resin composition on a substrate to provide a resist film;

(2) exposing the resist film; and (3) developing the exposed resist film with a developer solution containing no less than 80% by mass of an organic solvent;

the radiation-sensitive resin composition including:

(A) a base polymer having an acid-labile group (hereinafter, may be also referred to as "polymer (A)" or "base polymer");

(B) a polymer having a content of fluorine atoms higher than a content of fluorine atoms of the base polymer (A) (hereinafter, may be also referred to as "polymer (B)" or "fluorine-atom-containing");

(C) a radiation-sensitive acid generator (hereinafter, may be also referred to as "acid generator (C)");

(D) a solvent; and (E) a compound having a relative permittivity greater than the relative permittivity of the solvent (D) by at least 15 (hereinafter, may be also referred to as "compound (E)"), and the content of the compound (E) being no less than 10 parts by mass and no greater than 200 parts by mass with respect to 100 parts by mass of the base polymer (A).

In addition to the base polymer (A), the polymer (B), the acid generator (C) and the solvent (D), the radiation-sensitive resin composition used in the resist pattern-forming method according to the embodiment of the present invention further includes the above-specified amount of the compound (E) having a relative permittivity different from the relative permittivity of the solvent (D) by at least the predetermined value, whereby the radiation-sensitive resin composition allows suppression of the formation of the missing contact hole. Although the reasons for the suppression are unclear, it is assumed, for example, that due to the compound (E) having a relative permittivity different from the relative permittivity of the solvent (D) by at least the predetermined value, uneven distribution of the polymer (B) having a content of fluorine atoms higher than a content of fluorine atoms of the base polymer (A) in the surface layer of the resist coating film can be promoted, and the like. As a result, it is likely that the reduction of proportion of the base polymer (A) having an acid-labile group present in the surface of the resist film is allowed, and formation of an unresolved hole pattern, so-called missing contact holes, is effectively prevented. Thus, by combining the composition including the above-specified compound with the resist pattern-forming method involving the use of the developer solution containing no less than 80% by mass of an organic solvent, effect of suppression of the missing contact holes and formation of resist patterns exhibiting superior lithography characteristics can be achieved.

The compound (E) preferably has a relative permittivity of no less than 20 and no greater than 75. According to the radiation-sensitive resin composition, due to the relative permittivity of the compound (E) falling within the above range, uneven distribution of the polymer (B) in the surface layer of the resist film can be further promoted to a greater extent, and formation of missing contact holes can be further suppressed, while further improving lithography characteristics.

The compound (E) preferably has a boiling point of no less than 180° C. and no greater than 300° C. at 1 atm. When the boiling point of the compound (E) falls within the above-specified range, the proportion of the compound (E) present in the resist coating film can be increased after the solvent (D) is evaporated during prebaking (PB) and the like. As a result, the uneven distribution of the polymer (B) in the surface layer of the resist film may be further promoted, and formation of missing contact holes can be further suppressed, while further improving lithography characteristics.

The compound (E) is preferably a lactone compound, a cyclic carbonate compound or a combination thereof. Due to the compound (E) being the above-specified compound, the uneven distribution of the polymer (B) in the surface layer of the resist film can be promoted, and formation of missing contact holes can be more effectively suppressed, while further improving lithography characteristics.

The acid-labile group of the base polymer (A) preferably includes a monocyclic or polycyclic alicyclic hydrocarbon group. Due to the base polymer (A) including the alicyclic hydrocarbon group, acid dissociability of the acid-labile group can be improved, and thereby resolving ability of the pattern formed can be enhanced, while further improving lithography characteristics.

A radiation-sensitive resin composition according to an embodiment of the present invention includes:

(A) a base polymer having an acid-labile group;

(B) a polymer having a content of fluorine atoms higher than a content of fluorine atoms of the base polymer (A);

(C) a radiation-sensitive acid generator;

(D) a solvent; and (E) a compound having a relative permittivity greater than the relative permittivity of the solvent (D) by at least 15, wherein the content of the compound being no less than 10 parts by mass and no greater than 200 parts by mass with respect to 100 parts by mass of the base polymer (A), the radiation-sensitive resin composition being for use in a resist pattern-forming method including using a developer solution containing no less than 80% by mass of an organic solvent.

By using the radiation-sensitive resin composition in the resist pattern-forming method involving the use of the developer solution containing an organic solvent, the formation of missing contact holes can be effectively suppressed.

The values of the relative permittivity used herein are those measured and determined at 25° C. in accordance with the method defined in JIS C2138.

According to embodiments of the present invention, a resist pattern-forming method and a radiation-sensitive resin composition can be provided which are suitable for immersion lithography processes, leading to superior lithography characteristics such as suppression of the formation of missing contact holes in formation of a resist pattern using an organic solvent as the developer solution. The embodiments will now be described in detail.

Resist Pattern-Forming Method

The embodiment of the present invention relates to a resist pattern-forming method, including the steps of: (1) coating a radiation-sensitive resin composition on a substrate to provide a resist film; (2) exposing the resist film; and (3) developing the exposed resist film with a developer solution containing no less than 80% by mass of an organic solvent, the radiation-sensitive resin composition including: (A) a base polymer having an acid-labile group; (B) a polymer having a content of fluorine atoms higher than a content of fluorine atoms of the base polymer (A); (C) a radiation-sensitive acid generator; (D) a solvent; and (E) a compound having a relative permittivity greater than the relative permittivity of the solvent (D) by at least 15, and the content of the compound (E) being no less than 10 parts by mass and no greater than 200 parts by mass with respect to 100 parts by mass of the base polymer (A). Hereinafter, each step will be described in detail.

Step (1)

In this step, the composition used in the embodiment of the present invention is coated on a substrate to provide a resist film. As the substrate, for example, conventionally well-known substrates such as a silicon wafer and a wafer coated with aluminum can be used. In addition, organic or inorganic antireflective films disclosed in, for example, Japanese Examined Patent Application, Publication No. H06-12452, Japanese Unexamined Patent Application, Publication No. S59-93448, and the like may be provided on the substrate.

A coating method of the resist film material is exemplified by spin-coating, cast coating, roll coating, and the like. It is to be noted that the film thickness of the resist film provided is typically 0.01 μm to 1 μm, and preferably 0.01 μm to 0.5 μm.

After coating the radiation-sensitive resin composition, a solvent in the coating film may be volatilized as needed by prebaking (PB). The temperature for PB may be appropriately selected depending on the formulation of the photoresist composition, and is typically about 30° C. to 200° C. and preferably 50° C. to 150° C. The time for PB is typically 5 sec to 600 sec, and preferably 30 sec to 150 sec.

A protective film as disclosed in Japanese Unexamined Patent Application Publication No. H05-188598 or the like may be provided on the resist layer so that the resist film is not affected by basic impurities and the like contained in the environmental atmosphere. Furthermore, in order to prevent outflow of the acid generating agent and the like from the resist layer, a liquid immersion lithography protective film as disclosed in Japanese Unexamined Patent Application Publication No. 2005-352384 or the like may be provided on the resist layer. These techniques may be used in combination.

Step (2)

In this step, the resist film provided in the step (1) is exposed at a desired region by carrying out reduction projection through a mask having a specific pattern, and an immersion liquid as needed. For example, an isolated trench (iso-trench) pattern can be formed by carrying out reduced projection exposure at a desired region through a mask having an isolated line (iso-line) pattern. Also, the exposure may be carried out at least twice depending on the desired pattern and the mask pattern. When the exposure is carried out at least twice, the exposure is preferably carried out continuously. When the exposure is carried out a plurality of times, for example, first reduced projection exposure is carried out through a line-and-space pattern mask at a desired region, and subsequently second reduced projection exposure is carried out such that lines cross over light-exposed sites subjected to the first exposure. The first light-exposed sites are preferably orthogonal to the second light-exposed sites. Due to being orthogonal with each other, a circular contact hole pattern can be easily formed at light-unexposed sites surrounded by light-exposed sites. It is to be noted that, examples of the immersion liquid for use in the exposure include water, a fluorine-containing inert liquid, and the like. It is preferred that the immersion liquid be transparent to the exposure wavelength, and has a temperature coefficient of the refractive index as small as possible so that distortion of an optical image projected onto the film is minimized. When using an ArF excimer laser (wavelength: 193 nm) as the exposure light source, it is preferred to use water from the viewpoint of availability and ease of handling, in addition to the viewpoints described above. When water is used, a marginal amount of an additive which reduces the surface tension of water and imparts enhanced surfactant power may be added. It is preferred that the additive hardly dissolves a resist layer on a wafer and has a negligible influence on an optical coating of an inferior face of a lens. The water for use is preferably distilled water.

A radioactive ray used for the exposure is appropriately selected in accordance with the type of the acid generator (C), and is exemplified by an ultraviolet ray, a far ultraviolet ray, an X-ray, a charged particle ray, and the like. Among these, a far ultraviolet ray typified by an ArF excimer laser or a KrF excimer laser (wavelength: 248 nm) is preferred, and an ArF excimer laser is more preferred. The exposure conditions such as an exposure dose are appropriately selected in accordance with the formulation, and type of additives etc. of the composition. The resist pattern-forming method of the embodiment of the present invention may include a plurality of the exposure steps, and light sources employed in the exposure carried out a plurality of times may be identical or different, but an ArF excimer laser beam is preferably used in the first exposure.

In addition, it is preferred that post-exposure baking (PEB) is carried out after the exposure. When the PEB is carried out, a dissociation reaction of an acid-labile group in the composition can smoothly proceed. The temperature for PEB may be typically 30° C. to 200° C., and preferably 50° C. to 170° C. The time for PEB is typically 5 sec to 600 sec, and preferably 10 sec to 300 sec.

Step (3)

In this step, after the exposure in the step (2), development is carried out using a negative developer solution containing no less than 80% by mass of an organic solvent to form a pattern. The negative developer solution as referred to means a developer solution that selectively dissolve and remove poorly light-exposed sites and light-unexposed sites. The organic solvent contained in the negative developer solution is preferably an alcohol solvent, an ether solvent, a ketone organic solvent, an amide solvent, an ester organic solvent, a hydrocarbon solvent or a combination thereof.

Examples of the alcohol solvent include:

monohydric alcohol solvents such as methanol, ethanol, n-propanol, iso-propanol, n-butanol, iso-butanol, sec-butanol, tert-butanol, n-pentanol, iso-pentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol and diacetone alcohol;

polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol and tripropylene glycol;

partially etherified polyhydric alcohol solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether and dipropylene glycol monopropyl ether, and the like.

Examples of the ether solvent include diethyl ether, dipropyl ether, dibutyl ether, diphenyl ether, methoxybenzene, and the like.

Examples of the ketone solvent include acetone, 2-butanone, methyl n-propyl ketone, methyl n-butyl ketone, diethyl ketone, methyl isobutyl ketone, methyl n-pentyl ketone, ethyl n-butyl ketone, methyl n-hexyl ketone, di-isobutyl ketone, trimethylnonanone, cyclopentanone, cyclohexanone, cycloheptanone, cyclooctanone, methylcyclohexanone, 2,4-pentanedione, acetonyl acetone, acetophenone, and the like.

Examples of the amide solvent include N,N'-dimethylimidazolidinone, N-methylformamide, N,N-dimethylformamide, N,N-diethylformamide, acetamide, N-methylacetamide, N,N-dimethylacetamide, N-methylpropionamide, N-methylpyrrolidone, and the like.

The examples of the ester solvent include diethyl carbonate, propylene carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, diglycol acetate, methoxytriglycol acetate, ethyl propionate, n-butyl propionate, iso-amyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like.

Examples of the hydrocarbon solvent include:

aliphatic hydrocarbon solvents such as n-pentane, iso-pentane, n-hexane, iso-hexane, n-heptane, iso-heptane, 2,2,4-trimethylpentane, n-octane, iso-octane, cyclohexane, and methylcyclohexane;

aromatic hydrocarbon solvents such as benzene, toluene, xylene, mesitylene, ethylbenzene, trimethylbenzene, methylethylbenzene, n-propylbenzene, isopropylbenzene, diethylbenzene, isobutylbenzene, triethylbenzene, di-isopropylbenzene, n-amylnaphthalene, and the like.

Of these, n-butyl acetate, isopropyl acetate, amyl acetate, 2-butanone, methyl n-butyl ketone and methyl n-pentyl ketone are preferred. These organic solvents may be used either alone, or in combination of two or more thereof.

The content of the organic solvent in the developer solution is no less than 80% by mass, preferably no less than 85% by mass, and more preferably no less than 90% by mass. When the amount of the organic solvent contained the developer solution falls within the above range, light-unexposed sites can be effectively dissolved and removed, and a pattern that is superior in missing contact hole suppressibility, development characteristics and lithography characteristics can be formed. It should be noted that components other than the organic solvent are exemplified by water, silicone oil, and the like.

A surfactant may be added to the developer solution in an appropriate amount as needed. As the surfactant, for example, an ionic or nonionic fluorochemical surfactant and/or a silicone surfactant, and the like may be used.

Examples of the development method include a dipping method that immerses the substrate in a container filled with the developer for a given time, a puddle method that allows the developer to be present on the surface of the substrate due to surface tension for a given time, a spraying method that sprays the developer onto the surface of the substrate, a dynamic dispensing method that applies the developer to the substrate that is rotated at a constant speed while scanning with a developer application nozzle at a constant speed, and the like.

In the pattern-forming method, the resist film is preferably rinsed with a rinse agent after the development in the step (3). As the rinse agent, an organic solvent may be preferably used similarly to the developer solution, whereby scum generated can be efficiently washed away. The rinse agent is preferably a hydrocarbon solvent, a ketone solvent, an ester solvent, an alcohol solvent, an amide solvent, or the like. Of these, an alcohol solvent and an ester solvent are preferred, and a monovalent alcohol solvent having 6 to 8 carbon atoms is more preferred. The monovalent alcohol having 6 to 8 carbon atoms is exemplified linear, branched or cyclic monovalent alcohols, and examples thereof include 1-hexanol, 1-heptanol, 1-octanol, 4-methyl-2-pentanol, 2-hexanol, 2-heptanol, 2-octanol, 3-hexanol, 3-heptanol, 3-octanol, 4-octanol, benzyl alcohol, and the like. Of these, 1-hexanol, 2-hexanol, 2-heptanol, and 4-methyl-2-pentanol are preferred. It is to be noted that, the rinse agent is preferably selected as appropriate in accordance with a combination of the radiation-sensitive resin composition and the developer solution.

Each component of the rinse agent may be used either alone, or in combination of two or more thereof. The moisture content of the rinse agent is preferably no greater than 10% by mass, more preferably no greater than 5% by mass, and still more preferably no greater than 3% by mass. When the moisture content is no greater than the above-specified numerical values, favorable development characteristics can be attained. It is to be noted that, a surfactant described later may be added to the rinse agent.

Examples of the rinsing method include a spinning method that applies the rinse agent to the substrate that is rotated at a constant speed, a dipping method that immerses the substrate in a container filled with the rinse agent for a given time, a spraying method that sprays the rinse agent onto the surface of the substrate, and the like.

Radiation-Sensitive Resin Composition

The radiation-sensitive resin composition used in the embodiment of the resist pattern-forming method contains (A) a polymer, (B) a polymer, (C) an acid generator, (D) a solvent and (E) a compound. The polymer (A) has an acid-labile group bonded to a polar group such as a carboxyl group, and the acid-labile group is dissociated by an action of an acid generated from the acid generator (C). The polymer (B) has a higher fluorine content than the polymer (A), and is unevenly distributed in the surface layer of the resist film, to improve hydrophobicity of the surface of the resist film. Furthermore, as a result of adding the compound (E) which has a relative permittivity different from the relative permittivity of the solvent (D) by at least the predetermined value, the uneven distribution of the polymer (B) in the resist surface is selectively promoted. Since this results in reduction of the concentration of the polymer (A) in the surface of the resist film, formation of missing contact holes can be effectively suppressed. In addition, the radiation-sensitive resin composition may further include other optional components, as long as the effects of the present invention are not impaired. Hereinafter, each component will be described in detail.

(A) Polymer

The polymer (A) is a base polymer which includes an acid-labile group. It is to be noted that the "base polymer" refers to a polymer which is a principal component of the polymer constituting the resist pattern formed from the radiation-sensitive resin composition, and preferably, a polymer which accounts for no less than 50% by mass with respect to the total polymer constituting the resist pattern. In addition, the "acid-labile group" means a group that substitutes for a hydrogen atom in a polar functional group such as a carboxyl group, and is dissociated by an action of an acid generated from the acid generator (C) upon exposure.

The polymer (A) preferably includes a structural unit (I) as the structural unit having the acid-labile group. Further, in addition to the structural unit (I), the polymer (A) preferably includes a structural unit (II) having a lactone-containing group or a cyclic carbonate-containing group, and may include a structural unit (III) having a hydrophilic functional group. The polymer (A) may include one, or two or more types of the respective structural units. Each structural unit will be described in detail below.

Structural Unit (I)

The polymer (A) preferably includes a structural unit (I) represented by the following formula (1).

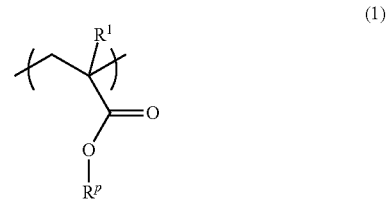

(1)

In the above formula (1), $R^1$ represents a hydrogen atom, a fluorine atom, a methyl group or a trifluoromethyl group; and $R^p$ represents an acid-labile group.

The acid-labile group represented by $R^p$ is preferably a group represented by the following formula (i).

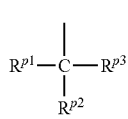

(i)

In the formula (i), $R^{p1}$ represents an alkyl group having 1 to 4 carbon atoms or a monovalent alicyclic hydrocarbon group having 4 to 20 carbon atoms; and $R^{p2}$ and $R^{p3}$ each independently represent an alkyl group having 1 to 4 carbon atoms or an alicyclic hydrocarbon group having 4 to 20 carbon atoms. It is to be noted that $R^{p2}$ and $R^{p3}$ optionally taken together represent a divalent alicyclic hydrocarbon group having 4 to 20 carbon atoms together with the carbon atom to which $R^{p2}$ and $R^{p3}$ each bond.

Examples of the alkyl group having 1 to 4 carbon atoms represented by $R^{p1}$, $R^{p2}$ and $R^{p3}$ include a methyl group, an ethyl group, a n-propyl group, an i-propyl group, a n-butyl group, a 2-methylpropyl group, a 1-methylpropyl group, a t-butyl group, and the like.

Examples of the monovalent alicyclic hydrocarbon group having 4 to 20 carbon atoms represented by $R^{p1}$, $R^{p2}$ and $R^{p3}$ include:

polycyclic alicyclic groups having a bridged skeleton such as an adamantane skeleton or a norbornane skeleton; and monocyclic alicyclic groups having a cycloalkane skeleton such as cyclopentane and cyclohexane. Also, these groups are unsubstituted or substituted with, for example, at least one linear, branched or cyclic alkyl group having 1 to 10 carbon atoms.

Of these, it is preferred that $R^{p1}$ represents an alkyl group having 1 to 4 carbon atoms, and $R^{p2}$ and $R^{p3}$ taken together represent a divalent group having an adamantane skeleton or a cycloalkane skeleton together with the carbon atom to which $R^{p2}$ and $R^{p3}$ bond.

Examples of the structural unit (I) include structural units represented by the following formulae (1-1) to (1-4).

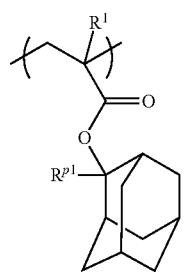

(1-1)

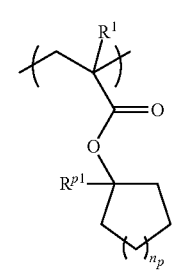

(1-2)

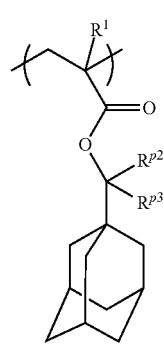

(1-3)

(1-4)

In the formulae (1-1) to (1-4), $R^1$ is as defined in the above formula (1); $R^{p1}$, $R^{p2}$ and $R^{p3}$ are as defined in the above formula (i); and $n_p$ is an integer of 1 to 4.

The structural unit represented by the above formula (1) or (1-1) to (1-4) is exemplified by structural units represented by the following formulae.

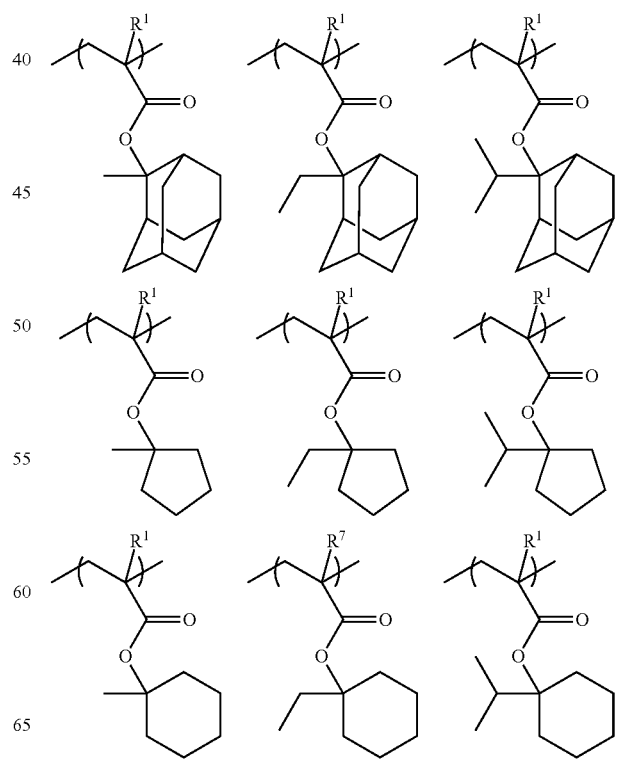

-continued

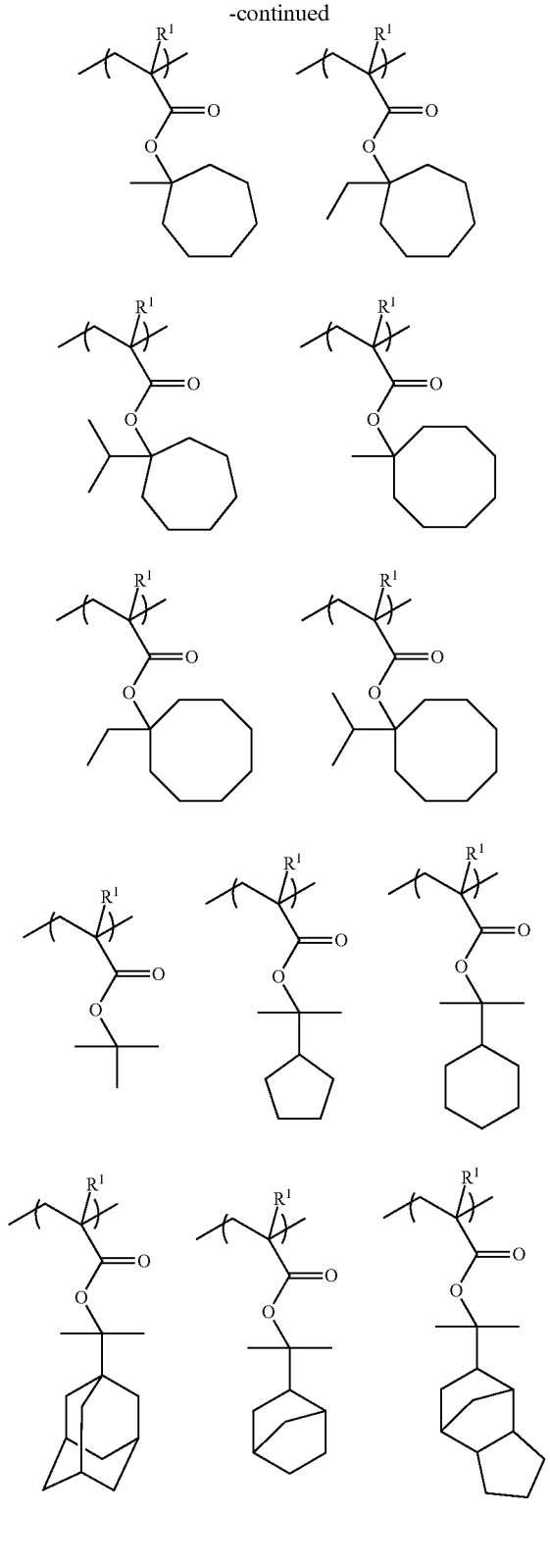

In the formulae, $R^1$ is as defined in the above formula (1).

In the polymer (A), the proportion of the total amount of the structural unit (I) contained with respect to the entire structural units constituting the polymer (A) is preferably 30 mol % to 60 mol %. When the proportion of the total amount of the structural unit (I) contained falls within the above range, the lithography characteristics of the radiation-sensitive resin composition tends to be further improved.

Structural Unit (II)

The polymer (A) preferably includes a structural unit (II) having a lactone-containing group or cyclic carbonate-containing group (hereinafter, may be also referred to as "structural unit (II)"). When the structural unit (II) is included, adhesiveness of the resist film to the substrate can be improved. Herein, the lactone-containing group indicates a cyclic group having one ring that includes a —O—C(O)— structure. Also, the cyclic carbonate-containing group indicates a cyclic group having one ring (cyclic carbonate ring) that includes a bond represented by —O—C(O)—O—. The lactone ring or cyclic carbonate ring is counted as the first ring, and when only the lactone ring or cyclic carbonate ring is included, the group is referred to as "monocyclic", whereas when other ring structure is further included, the group is referred to as "polycyclic" irrespective of its structure.

Examples of the structural unit (II) include structural units represented by the following formulae.

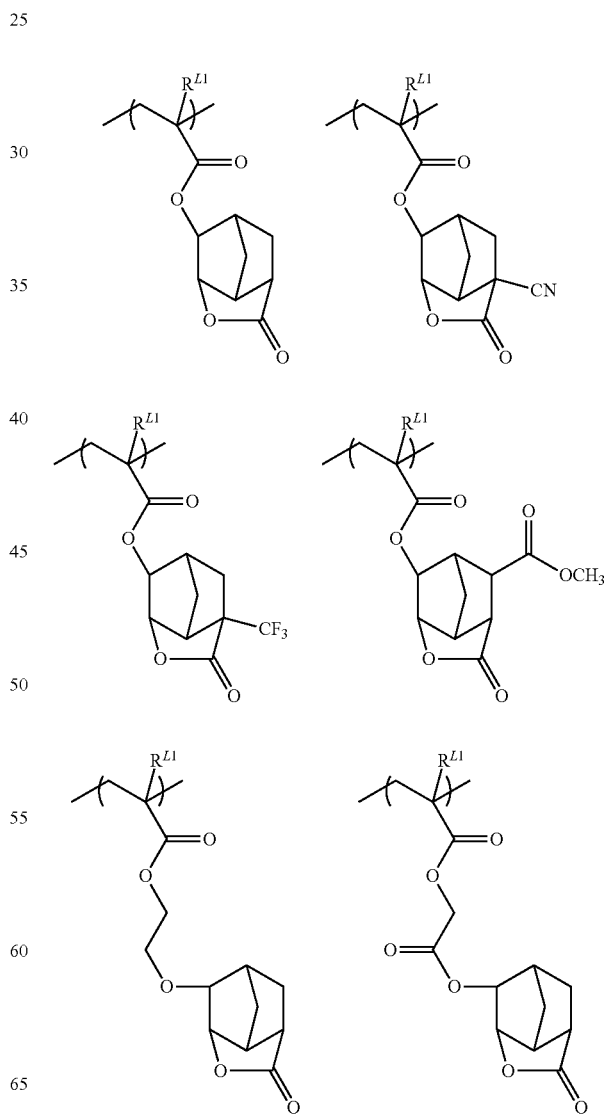

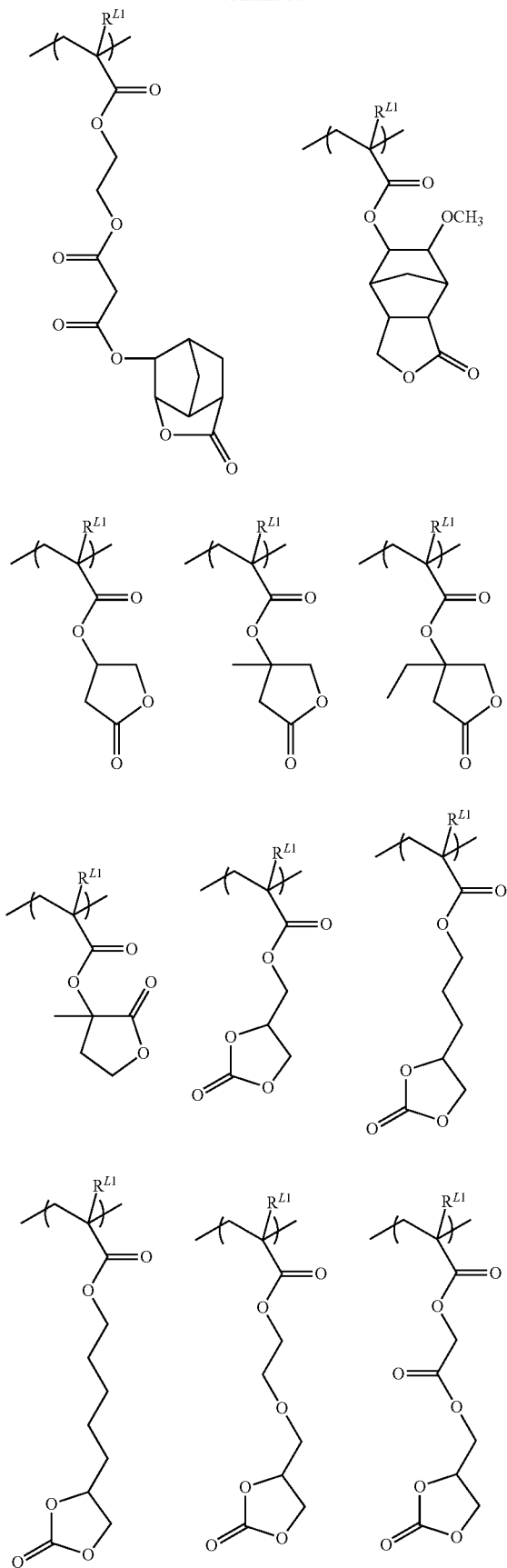
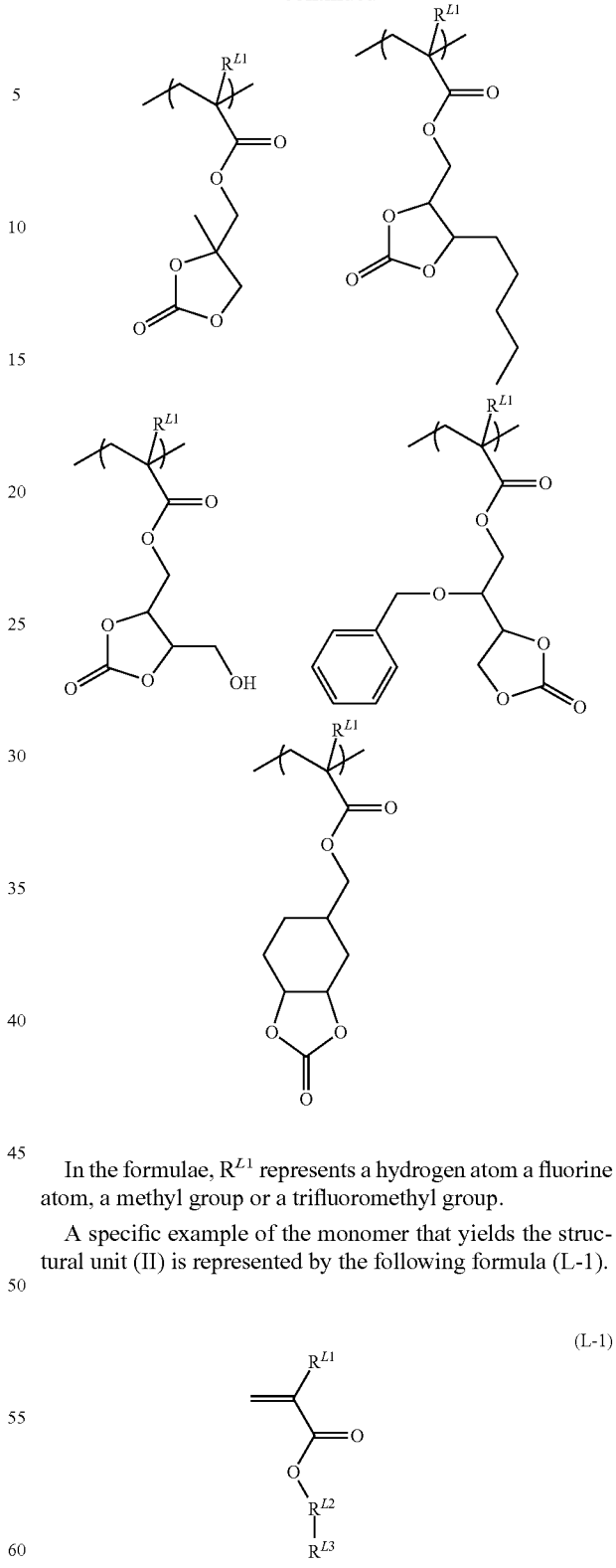

In the formulae, $R^{L1}$ represents a hydrogen atom a fluorine atom, a methyl group or a trifluoromethyl group.

A specific example of the monomer that yields the structural unit (II) is represented by the following formula (L-1).

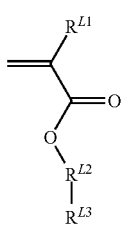

(L-1)

In the formula (L-1), $R^{L1}$ represents a hydrogen atom, a fluorine atom, a methyl group or a trifluoromethyl group; $R^{L2}$ represents a single bond or a divalent linking group; and $R^{L3}$ represents a monovalent organic group having a lactone ring or a cyclic carbonate ring.

The divalent linking group represented by $R^{L2}$ is exemplified by a divalent linear or branched hydrocarbon group having 1 to 20 carbon atoms, and the like.

Examples of the monovalent organic group having a lactone ring represented by $R^{L3}$ include groups represented by the following formulae (L3-1) to (L3-6), and examples of the monovalent organic group having a cyclic carbonate ring include groups represented by the following formulae (L3-7) and (L3-8).

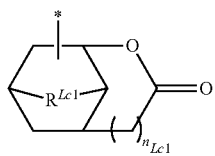
(L3-1)

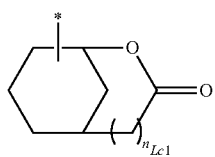
(L3-2)

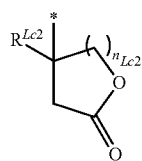
(L3-3)

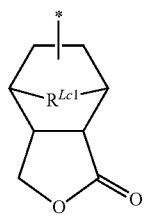
(L3-4)

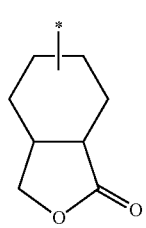
(L3-5)

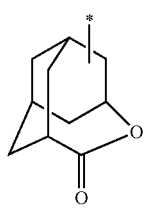
(L3-6)

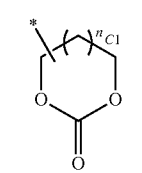
(L3-7)

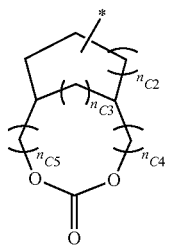
(L3-8)

In the formulae (L3-1) and (L3-4), $R^{Lc1}$ represents an oxygen atom or a methylene group;

in the above formula (L3-3), $R^{Lc2}$ represents a hydrogen atom or an alkyl group having 1 to 4 carbon atoms;

in the above formulae (L3-1) and (L3-2), $n_{Lc1}$ is 0 or 1;

in the above formula (L3-3), $n_{Lc2}$ is an integer of 0 to 3;

in the above formula (L3-7), $n_{C1}$ is an integer of 0 to 2; and in the above formula (L3-8), $n_{C2}$ to $n_{C5}$ are each independently an integer of 0 to 2. * denotes an atomic bonding that links to $R^{L2}$ in the above formula (L-1). It is to be noted that the groups represented in the formulae (L3-1) to (L3-8) may have a substituent.

Preferable monomers that give the structural unit (II) include, for example, monomers described in paragraph [0074] of PCT International Publication No. 2007/116664.

In the polymer (A), the proportion of the total amount of the structural unit (II) contained with respect to the entire structural units constituting the polymer (A) is preferably 30 mol % to 60 mol %. When the proportion of the total amount of the structural unit (II) contained falls within the above range, adhesiveness of the resist pattern formed using the radiation-sensitive resin composition tends to be further improved.

Structural Unit (III)

The polymer (A) may include a structural unit having a hydrophilic functional group (hereinafter, may be also referred to as "structural unit (III)"). Examples of the structural unit (III) include structural units represented by the following formulae, and the like.

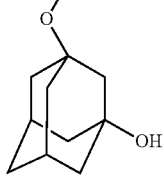 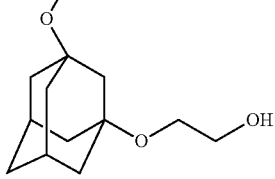

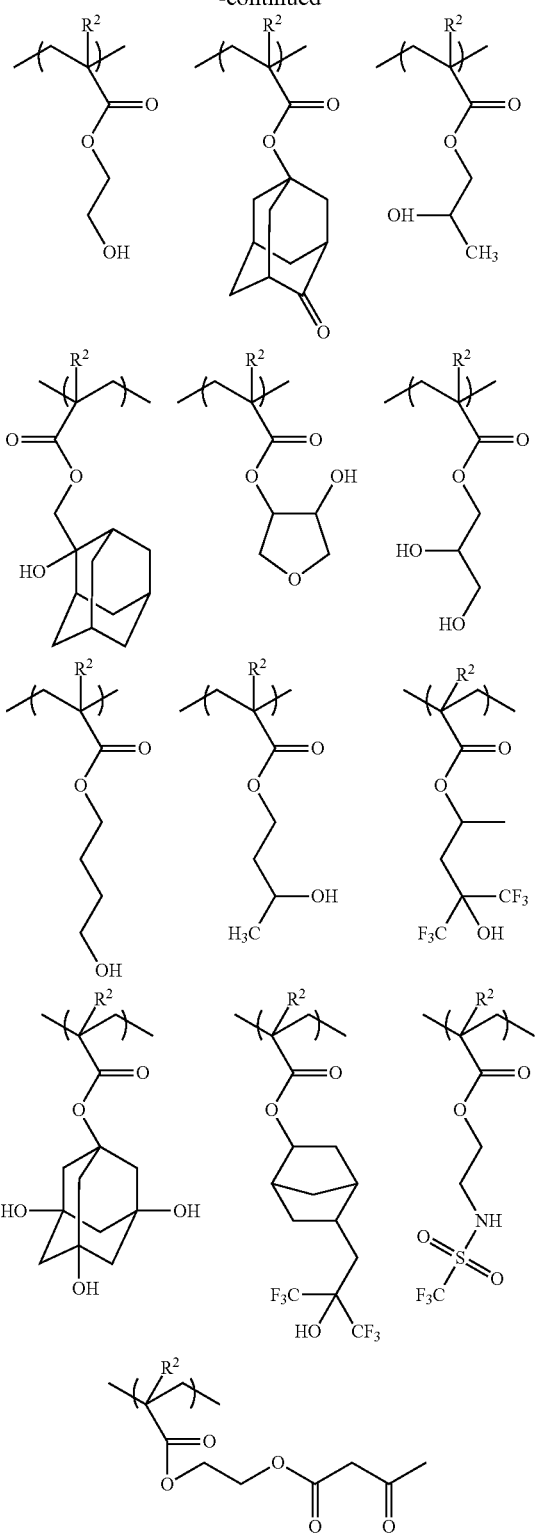

In the above formulae, R² represents a hydrogen atom, a fluorine atom, a methyl group or a trifluoromethyl group.

In the polymer (A), the proportion of the total amount of the structural unit (III) contained with respect to the entire structural units constituting the polymer (A) is preferably 0 mol % to 30 mol %, and more preferably 0 to 20 mol %.

The polymer (A) may include one, or two or more types of structural units other than those structural units as described above.

Synthesis Method of Polymer (A)

The polymer (A) may be prepared, for example, by polymerizing the monomer corresponding to each predetermined structural unit in an appropriate solvent using a radical polymerization initiator.

Examples of the radical initiator include azo radical initiators such as 2,2'-azobisisobutyronitrile (AIBN), 2,2'-azobis (4-methoxy-2,4-dimethylvaleronitrile), 2,2'-azobis(2-cyclopropylpropionitrile), 2,2'-azobis(2,4-dimethylvaleronitrile), dimethyl 2,2'-azobisisobutyrate; peroxide radical initiators such as benzoyl peroxide, t-butyl hydroperoxide, cumene hydroperoxide, and the like. Of these, AIBN is preferred. These radical initiators may be used either alone, or as a mixture of two or more thereof.

Examples of the solvent for use in the polymerization include:

alkanes such as n-pentane, n-hexane, n-heptane, n-octane, n-nonane and n-decane;

cycloalkanes such as cyclohexane, cycloheptane, cyclooctane, decalin and norbornane;

aromatic hydrocarbons such as benzene, toluene, xylene, ethylbenzene and cumene;

halogenated hydrocarbons such as chlorobutanes, bromohexanes, dichloroethanes, hexamethylene dibromide and chlorobenzene;

saturated carboxylate esters such as ethyl acetate, n-butyl acetate, i-butyl acetate and methyl propionate;

ketones such as acetone, 2-butanone, 4-methyl-2-pentanone and 2-heptanone;

ethers such as tetrahydrofuran, dimethoxyethanes and diethoxyethanes;

alcohols such as methanol, ethanol, 1-propanol, 2-propanol and 4-methyl-2-pentanol; and the like. These solvents may be used either alone, or in combination of two or more thereof.

The reaction temperature in the polymerization is typically 40° C. to 150° C., and preferably 50° C. to 120° C. The reaction time is typically 1 hour to 48 hrs, and preferably 1 hour to 24 hrs.

The weight average molecular weight (Mw) of the polymer (A) as determined by gel permeation chromatography (GPC) is preferably 1,000 to 100,000, more preferably 1,000 to 50,000, and still more preferably 1,000 to 30,000. When the Mw of the polymer (A) falls within the above range, resistance to dry-etching and cross-sectional shape of the resist pattern can be improved.

The ratio (Mw/Mn) of the Mw to the number average molecular weight (Mn) of the polymer (A) is typically 1 to 3, and preferably 1 to 2.

(B) Polymer

The polymer (B) has a content of fluorine atoms higher than a content of fluorine atoms of the polymer (A). When the radiation-sensitive resin composition for use in the pattern-forming method contains the polymer (B), in forming a resist film, the polymer (B) tends to be unevenly distributed in the surface layer of the resist film due to oil repellent characteristic feature of the polymer (B) in the film. Thus, containing the polymer (B) is preferred since elution of an acid generating agent, an acid diffusion control agent and the like into a liquid immersion medium can be prevented during liquid immersion lithography. In addition, owing to a water repellent feature of the polymer (B), an advancing contact angle of a liquid immersion medium on a resist film can be controlled to fall within a desired range, whereby formation of bubble defects can be suppressed. Furthermore, a higher receding contact angle of a liquid immersion medium on a resist film is attained, thereby enabling exposure by high-speed scanning without remaining water droplets.

In the embodiment of the present invention, due to the radiation-sensitive resin composition containing the compound (E), the uneven distribution of the polymer (B) in the surface layer of the resist film is effectively promoted. As a result, the proportion of the polymer (A), which is a base polymer for forming a resist pattern, present in the surface layer of the resist coating film will be lowered. Thus, formation of the missing contact hole, which is considered to be attributed to excess dissociation of the acid-labile group of the polymer (A) caused by the acid generated from the acid generator (C), and the like, can be effectively suppressed.

Although the polymer (B) is not particularly limited as long as the properties described above are attained, the polymer (B) preferably has a fluorinated alkyl group. When the polymer (B) has a fluorinated alkyl group in the structure thereof, the above-described characteristics can be further improved.

The polymer (B) is prepared by polymerizing one or more types of monomers that include a fluorine atom in the structure thereof. The monomers that include a fluorine atom in the structure thereof are exemplified by a monomer that includes a fluorine atom in its main chain, a monomer that includes a fluorine atom in its side chain, and a monomer that includes a fluorine atom in its main chain and side chain.

Examples of the monomer that includes a fluorine atom in its main chain include α-fluoroacrylate compounds, α-trifluoromethyl acrylate compounds, β-fluoroacrylate compounds, β-trifluoromethyl acrylate compounds, α,β-fluoroacrylate compounds, α,β-trifluoromethyl acrylate compounds, compounds derived by substituting hydrogen atom(s) of one or more types of vinyl moieties by a fluorine atom, a trifluoromethyl group, etc., and the like.

Further, examples of the monomer that includes a fluorine atom in its side chain include compounds in which an alicyclic olefin compound such as norbornene has fluorine, a fluoroalkyl group and/or a derivative thereof as a side chain, ester compounds of acrylic acid or methacrylic acid with a fluoroalkyl group and/or a derivative thereof, olefins having a fluorine atom, a fluoroalkyl group and/or a derivative thereof as one or more types of side chain (a site excluding a double bond), and the like.

Also, examples of the monomer that includes a fluorine atom in its main chain and side chain include ester compounds of α-fluoroacrylic acid, β-fluoroacrylic acid, α,β-fluoroacrylic acid, α-trifluoromethyl acrylic acid, β-trifluoromethyl acrylic acid, α,β-trifluoromethylacrylic acid or the like with a fluoroalkyl group and/or a derivative thereof, compounds derived by substituting hydrogen atom(s) of one or more types of vinyl moieties by a fluorine atom or a trifluoromethyl group and substituting a side chain of the compound with a fluorine atom, a fluoroalkyl group and/or a derivative thereof; alicyclic olefin compounds derived by substituting hydrogen atom(s) bonded to one or more types of double bonds by a fluorine atom or a trifluoromethyl group, etc., and having a fluorinated alkyl group and/or a derivative thereof as a side chain; and the like. The alicyclic olefin compound as referred to herein means a compound that includes a double bond in a part of its ring.

A structural unit that imparts a fluorine atom to the polymer (B) is not particularly limited, as described above, and a structural unit represented by the following formula (F1) (hereinafter, may be also referred to as "structural unit (F-I)") is preferably used as a fluorine-imparting structural unit.

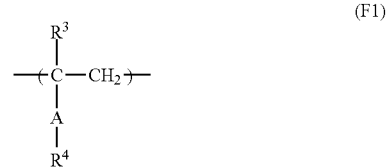

In the above formula (F1), $R^3$ represents a hydrogen atom, a fluorine atom, a methyl group or a trifluoromethyl group; "A" represents a single bond or a divalent linking group; and $R^4$ represents a linear or branched alkyl group having 1 to 6 carbon atoms, or a monovalent alicyclic hydrocarbon group having 4 to 20 carbon atoms or derivative groups thereof, having at least one fluorine atoms.

Examples of the divalent linking group represented by the A in the above formula (F1) include an oxygen atom, a sulfur atom, a carbonyloxy group, an oxycarbonyl group, an amide group, a sulfonylamide group, a urethane group, and the like.

Examples of preferred monomers which give the above structural unit (F-I) include (meth)acrylic acid trifluoromethyl ester, (meth)acrylic acid 2,2,2-trifluoroethyl ester, (meth)acrylic acid perfluoroethyl ester, (meth)acrylic acid perfluoro-n-propyl ester, (meth)acrylic acid perfluoro-1-propyl ester, (meth)acrylic acid perfluoro-n-butyl ester, (meth)acrylic acid perfluoro-1-butyl ester, (meth)acrylic acid perfluoro-t-butyl ester, (meth)acrylic acid 2-(1,1,1,3,3,3-hexafluoropropyl)ester, (meth)acrylic acid 1-(2,2,3,3,4,4,5,5-octafluoropentyl)ester, (meth)acrylic acid perfluorocyclohexylmethyl ester, (meth)acrylic acid 1-(2,2,3,3,3-pentafluoropropyl)ester, (meth)acrylic acid 1-(3,3,4,4,5,5,6,6,7,7,8,8,9,9,10,10,10-heptadecafluorodecyl) ester, (meth)acrylic acid 1-(5-trifluoromethyl-3,3,4,4,5,6,6,6-octafluorohexyl)ester, and the like.

The polymer (B) may include only one type or two or more types of the structural unit (F-I). The proportion of the structural unit (F-I) included with respect to the entire structural units in the polymer (B) is typically no less than 5 mol %, preferably no less than 10 mol %, and more preferably no less than 15 mol %. When the proportion of the structural unit (F-I) included is less than 5 mol %, the receding contact angle of no less than 70° may not be achieved, and/or elution of the acid generating agent and the like from the resist coating film may not be suppressed.

In addition to the structural unit including a fluorine atom in its structure as described above, the polymer (B) may include at least one type of "other structural units" such as, for example: in order to control rates of dissolution in developer solutions, a structural unit having an acid-labile group, a structural unit having a lactone skeleton, a cyclic carbonate skeleton, a hydroxyl group, a carboxyl group or the like, a structural unit having an alicyclic compound; and/or a structural unit derived from an aromatic compound for inhibiting scattering by reflection of light from the substrate.

As the other structural unit having an acid-labile group, a structural unit similar to the structural unit (I) of the polymer (A) (hereinafter, may be also referred to as "structural unit (F-II)") may be used.

The monomer which gives the other structural unit having an acid-labile group is preferably (meth)acrylic acid 2-methyladamantyl-2-yl ester, (meth)acrylic acid 2-ethyladamantyl-2-yl ester, (meth)acrylic acid 2-methylbicyclo[2.2.1]hept-2-yl ester, (meth)acrylic acid 2-ethylbicyclo[2.2.1]hept-2-yl ester, (meth)acrylic acid 1-(bicyclo[2.2.1]hept-2-yl)-1-methylethyl ester, (meth)acrylic acid 1-(adamantan-1-yl)-1-methylethyl ester, (meth)acrylic acid 1-methyl-1-cyclopentyl ester, (meth)acrylic acid 1-ethyl-1-cyclopentyl ester, (meth)acrylic acid 1-methyl-1-cyclohexyl ester, (meth)acrylic acid 1-ethyl-1-cyclohexyl ester, and the like.

As the other structural unit having a lactone skeleton or a cyclic carbonate skeleton, a structural unit similar to the structural unit (II) of the polymer (A) may be used (hereinafter, may be also referred to as "structural unit (F-III)").

The other structural unit having an alicyclic group (hereinafter, may be also referred to as "structural unit (F-IV)") is exemplified by a structural unit represented by the following formula (F2).

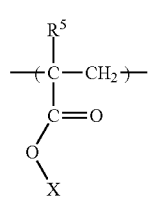

(F2)

In the above formula (F2), $R^5$ represents a hydrogen atom, a fluorine atom, a methyl group or a trifluoromethyl group; and X represents a monovalent alicyclic hydrocarbon group having 4 to 20 carbon atoms.

The monovalent alicyclic hydrocarbon group having 4 to 20 carbon atoms represented by X in the above formula (F2) is exemplified by hydrocarbon groups having an alicyclic ring derived from a cycloalkane such as cyclobutane, cyclopentane, cyclohexane, bicyclo[2.2.1]heptane, bicyclo[2.2.2]octane, tricyclo[5.2.1.0$^{2,6}$]decane, tetracyclo[6.2.1.1$^{3,6}$.0$^{2,7}$]dodecane, tricyclo[3.3.1.1$^{3,7}$]decane.

The cycloalkane-derived alicyclic ring may have a substituent, and is optionally substituted with at least one of a linear, branched or cyclic alkyl group having 1 to 4 carbon atoms such as, for example, a methyl group, an ethyl group, a n-propyl group, an i-propyl group, a n-butyl group, a 2-methylpropyl group, a 1-methylpropyl group, a t-butyl group. The cycloalkane-derived alicyclic ring is not limited to these alkyl group-substituted ones, and may be cycloalkane-derived alicyclic rings substituted with a hydroxyl group, a cyano group, a hydroxyalkyl group having 1 to 10 carbon atoms, a carboxyl group or oxygen.

Examples of preferred monomers which give the above structural unit (F-IV) include (meth)acrylic acid bicyclo[2.2.1]hept-2-yl ester, (meth)acrylic acid bicyclo[2.2.2]oct-2-yl ester, (meth)acrylic acid tricyclo[5.2.1.0$^{2,6}$]dec-7-yl ester, (meth)acrylic acid tetracyclo[6.2.1.1$^{3,6}$.0$^{2,7}$]dodec-9-yl ester, (meth)acrylic acid tricyclo[3.3.1.1$^{3,7}$]dec-1-yl ester, (meth)acrylic acid tricyclo[3.3.1.1$^{3,7}$]dec-2-yl ester, and the like.

In addition, examples of preferred monomers which give the other structural unit derived from an aromatic compound (hereinafter, may be also referred to as "structural unit (F-V)") include styrene, α-methylstyrene, 2-methylstyrene, 3-methylstyrene, 4-methylstyrene, 2-methoxystyrene, 3-s methoxystyrene, 4-methoxystyrene, 4-(2-t-butoxycarbonylethyloxy) styrene, 2-hydroxystyrene, 3-hydroxystyrene, 4-hydroxystyrene, 2-hydroxy-α-methylstyrene, 3-hydroxy-α-methylstyrene, 4-hydroxy-α-methylstyrene, 2-methyl-3-hydroxystyrene, 4-methyl-3-hydroxystyrene, 5-methyl-3-hydroxystyrene, 2-methyl-4-hydroxystyrene, 3-methyl-4-hydroxystyrene, 3,4-dihydroxystyrene, 2,4,6-trihydroxystyrene, 4-t-butoxystyrene, 4-t-butoxy-α-methylstyrene, 4-(2-ethyl-2-propoxy)styrene, 4-(2-ethyl-2-propoxy)-α-methylstyrene, 4-(1-ethoxyethoxy)styrene, 4-(1-ethoxyethoxy)-α-methylstyrene, phenyl(meth)acrylate, benzyl(meth)acrylate, acenaphthylene, 5-hydroxyacenaphthylene, 1-vinylnaphthalene, 2-vinylnaphthalene, 2-hydroxy-6-vinylnaphthalene, 1-naphthyl(meth)acrylate, 2-naphthyl(meth)acrylate, 1-naphthylmethyl(meth)acrylate, 1-anthryl(meth)acrylate, 2-anthryl(meth)acrylate, 9-anthryl(meth)acrylate, 9-anthrylmethyl(meth)acrylate, 1-vinylpyrene, and the like.

In the polymer (B), only one type or two or more types of the "other structural unit" typified by the structural unit (F-II), the structural unit (F-III), the structural unit (F-IV), and the structural unit (F-V) may be included. The proportion of the other structural unit included with respect to the entire structural units constituting the polymer (B) is typically no greater than 80 mol %, preferably no greater than 75 mol %, and still more preferably no greater than 70 mol %.

In addition, the polymer (B) may include other structural unit than the structural units (F-I) to (F-V) within a range not leading to impairment of the effects of the present invention.

In addition, the fluorine content (% by mass) of the polymer (A) and the polymer (B) can be determined by measuring a $^{13}$C-NMR, $^1$H-NMR, or IR spectrum.

The content of the polymer (B) contained in the solid content of the radiation-sensitive resin composition is preferably no less than 1% by mass and no greater than 10% by mass, more preferably no less than 1.5% by mass and no greater than 8% by mass, and still more preferably no less than 2% by mass and no greater than 3% by mass. When the content of the polymer (B) falls within the above range, pattern formability in liquid immersion lithography is likely to be further improved.

Synthesis Method of Polymer (B)

The polymer (B) may be prepared, for example, by polymerizing the monomer corresponding to each predetermined structural unit in an appropriate solvent using a radical polymerization initiator.

The radical initiator and the solvent for use in the polymerization are exemplified by those listed in connection with the synthesis method of the polymer (A).

Typically, the reaction temperature in the polymerization is preferably 40° C. to 150° C., and more preferably 50° C. to 120° C. Typically, the reaction time is preferably 1 hour to 48 hrs, and more preferably 1 hour to 24 hrs.

The Mw of the polymer (B) is preferably 1,000 to 50,000, more preferably 1,000 to 30,000, and particularly preferably 1,000 to 10,000. When the Mw of the polymer (B) is less than 1,000, it is impossible to attain a sufficient advancing contact angle. On the other hand, the Mw of the polymer (B) exceeding 50,000 is likely to result in deteriorated developability of the resultant resist.

(C) Acid Generator

The acid generator (C) generates an acid upon exposure, and the acid allows an acid-labile group present in the polymer (A) to be dissociated, thereby generating a carboxyl group and the like. As a result, the polymer (A) becomes hardly soluble in developer solutions.

The mode of incorporation of the acid generator (C) into the composition may be a form of being incorporated as a compound as described below (hereinafter, may be also referred to as "(C) acid generating agent", as appropriate), a form of being incorporated as a part of a polymer, or a combination of these two forms.

The acid generating agent (C) is exemplified by an onium salt compound, a sulfonimide compound, a halogen-containing compound, a diazo ketone compound, and the like. Of these acid generating agents (C), onium salt compounds are preferred.

Examples of the onium salt compound include sulfonium salts, tetrahydrothiophenium salts, iodonium salts, phosphonium salts, diazonium salts, pyridinium salts, and the like.

Examples of the sulfonium salt include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, triphenylsulfonium camphorsulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-cyclohexylphenyldiphenylsulfonium camphorsulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, 4-methanesulfonylphenyldiphenylsulfonium camphorsulfonate, triphenylsulfonium 1,1,2,2-tetrafluoro-6-(1-adamantanecarbonyloxy)-hexane-1-sulfonate, and the like. Among these, triphenylsulfonium trifluoromethanesulfonate, triphenylsulfonium nonafluoro-n-butanesulfonate, and triphenylsulfonium 1,1,2,2-tetrafluoro-6-(1-adamantanecarbonyloxy)-hexane-1-sulfonate are preferred.

Examples of the tetrahydrothiophenium salt include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-bicyclo[2.2.1]hept-2-yl-1,1,2,2-tetrafluoroethanesulfonate, 1-(4-n-butoxynaphthalen-1-yl)tetrahydrothiophenium camphorsulfonate, 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl)tetrahydrothiophenium 2-bicyclo[2.2.1]hept-2-yl-1,1,2,2-tetrafluoroethanesulfonate, 1-(6-n-butoxynaphthalen-2-yl)tetrahydrothiophenium camphorsulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate, 1-(3,5-dimethyl-4-hydroxyphenyl)tetrahydrothiophenium camphorsulfonate, and the like. Among these tetrahydrothiophenium salts, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate and 1-(3,5-dimethyl-4-hydroxyphenyl)tetrahydrothiophenium nonafluoro-n-butanesulfonate are preferred.

Examples of the iodonium salt include diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, diphenyliodonium camphorsulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, bis(4-t-butylphenyl)iodonium camphorsulfonate, and the like. Among these iodonium salts, bis(4-t-butylphenyl)iodonium nonafluoro-n-butanesulfonate is preferred.

Examples of the sulfonimide compound include N-(trifluoromethanesulfonyloxy)bicyclo[2.2.1]hept-5-ene-2,3-dicarboxylmide, N-(nonafluoro-n-butanesulfonyloxy)bicyclo[2.2.1]hept-5-ene-2,3-dicarboxylmide, N-(perfluoro-n-octanesulfonyloxy)bicyclo[2.2.1]hept-5-ene-2,3-dicarboxylmide, N-(2-bicyclo[2.2.1]hept-2-yl-1,1,2,2-tetrafluoroethanesulfonyloxy)bicyclo[2.2.1]hept-5-ene-2,3-dicarboxylmide, N-(2-(3-tetracyclo[4.4.0.1$^{2,5}$.1$^{7,10}$]dodecanyl)-1,1-difluoroethanesulfonyloxy)bicyclo[2.2.1]hept-5-ene-2,3-dicarboxylmide, N-(camphorsulfonyloxy)bicyclo[2.2.1]hept-5-ene-2,3-dicarboxylmide, and the like. Among these sulfonimide compounds, N-(trifluoromethanesulfonyloxy)bicyclo[2.2.1]hept-5-ene-2,3-dicarboxylmide is preferred.

These acid generating agents (C) may be used either alone, or in combination of two or more thereof. The amount of the acid generator (C) employed in the case of the acid generator (C) being the acid generating agent is typically no less than 0.1 parts by mass and no greater than 20 parts by mass, and preferably no less than 0.5 parts by mass and no greater than 15 parts by mass with respect to 100 parts by mass of the polymer (A) in view of ensuring the sensitivity and developability for use as a resist. In this case, when the amount of the acid generating agent (C) employed is less than the above-specified amount, the sensitivity and developability tend to be deteriorated, whereas the amount of the acid generating agent (C) exceeding 15 parts by mass is likely to result in reduction of radiation transmittance, and to render the formation of the desired resist patterns difficult.

(D) Solvent

The solvent (D) is not particularly limited as long as the solvent (D) can at least dissolve the polymer (A), the polymer (B), the acid generator (C) and the compound (E), and optional components added as required. Examples of the solvent include alcohol solvents, ether solvents, ketone solvents, amide solvents, ester solvents and mixed solvent thereof, and the like.

Specific examples of the solvent (D) include similar organic solvents to those exemplified in connection with the pattern formation step (3) as described above, and the like. Of these, propylene glycol monomethyl ether acetate and cyclohexanone are preferred. These solvents may be used either alone, or in combination of two or more thereof.

Compound (E)

The compound (E) has a relative permittivity greater than the relative permittivity of the solvent (D) by at least 15. Since the compound (E) has a relative permittivity greater than that of the solvent (D) by at least the predetermined value, uneven distribution of the polymer (B) having a content of fluorine atoms higher than a content of fluorine atoms of the polymer (A) in the surface of the resist is selectively promoted. This results in the decrease of the concentration of the polymer (A) in the surface of the resist film, whereby the formation of missing contact holes can be effectively prevented. In addition, by improving water repellent characteristic feature of the polymer (B), liquid immersion lithography by high-speed scanning can be performed at higher speed. Furthermore, due to the compound (E) being contained in the radiation-sensitive resin composition, the polymer (B) is unevenly distributed in the surface layer of the resist film in an efficient manner, which leads to the reduction of the amount of the polymer (B) added compared to those in conventional radiation-sensitive resin composition.

The compound (E) is not particularly limited as long as the compound (E) has a relative permittivity greater than the relative permittivity of the solvent (D) by at least 15. The compound (E) is preferably a low molecular weight compound having a relative permittivity of no less than 20 and no greater than 75, and more preferably a low molecular weight compound having a relative permittivity of no less than 25 and no greater than 70. Examples of the low molecular weight compound having a relative permittivity of no less than 20 and no greater than 75 include acetone, acetonitrile, dimethyl sulfoxide, N,N-dimethylformamide, 1-propanol, ethanol, methanol, formic acid, γ-butyrolactone, propylene carbonate, and the like.

The compound (E) is preferably a low molecular weight compound having a boiling point of no less than 180° C. and no greater than 300° C. at 1 atm, and more preferably a low molecular weight compound having a boiling point of no less than 190° C. and no greater than 280° C. When the compound (E) has the above-specified range of boiling point, the compound (E) can remain in the resist coating film even after prebaking (PB) and the like during the formation of the resist coating film, the uneven distribution of the polymer (B) in the surface layer of the resist film is more effectively promoted.

Examples of the low molecular weight compound having a boiling point of no less than 180° C. and no greater than 300° C. at 1 atm include diethylene glycol monobutyl ether, 4-methylaminolactam, γ-butyrolactone, 1,2-dichlorobenzene, 3-methyl-3-methoxybutyl acetate, 3,5,5-trimethyl-2-cyclohexen-1-one, diethylene glycol monobutyl ether, diethylene glycol monobutyl ether, propylene carbonate, and the like.

The compound (E) is preferably exemplified by lactone compounds or cyclic carbonate compounds.

Examples of the lactone compounds include γ-butyrolactone, valerolactone, mevalonic lactone, norbornanelactone, and the like. Of these, γ-butyrolactone is preferred.

Examples of the cyclic carbonate compounds include propylene carbonate, ethylene carbonate, butylene carbonate, vinylene carbonate, and the like. Of these, propylene carbonate is preferred.

The content of the compound (E) is no less than 10 parts by mass and no greater than 200 parts by mass with respect to 100 parts by mass of the polymer (A), preferably no less than 25 parts by mass and no greater than 150 parts by mass, and more preferably no less than 50 parts by mass and no greater than 150 parts by mass. When the content of the compound (E) is below the above-specified lower limit, the effect of promoting the uneven distribution of the polymer (B) in the surface layer of the resist film tend to be impaired, and the effect of suppressing the formation of the missing contact holes likely to be impaired. To the contrary, when the content of the compound (E) is above the above-specified upper limit, lithography characteristics may be deteriorated. The compound (E) may be used either alone, or in combination of two or more thereof.

Although the reason for being capable of improving water repellency of the photoresist film by adding the compound (E), which has a high relative permittivity, is unclear, it is assumed that adding the compound (E) having a high relative permittivity leads to the increase in polarity of the entire film, whereby agents having lower surface energy, for example, the polymer (B) including a fluorine atom, can be unevenly distributed in regions closer to the surface of the film.

Optional Component

In addition to the polymer (A), the polymer (B), the acid generator (C), the solvent (D) and the compound (E), the composition may include an acid diffusion controller, a surfactant, an alicyclic skeleton-containing compound, a sensitizing agent and the like as other optional components within a range not leading to impairment of the effects of the present invention.

Acid Diffusion Controller

The acid diffusion controller exerts the effect of controlling diffusion phenomenon of the acid generated from the acid generator (C) upon the exposure in the resist coating film, and suppressing unfavorable chemical reactions in unexposed regions; as a result, storage stability of the resultant radiation-sensitive resin composition is further improved, and resolution of the resist is further improved, while suppressing variation of line width of the resist pattern caused by variation of post-exposure delay (PED) from the exposure until a development treatment, which enables the radiation-sensitive resin composition with superior process stability to be obtained. The mode of incorporation of the acid diffusion controller into the composition may be in a low molecular weight compound form (hereinafter, may be also referred to as "acid diffusion control agent", as appropriate) or in an incorporated form as a part of the polymer, or in both of these forms.

Examples of the acid diffusion control agent include amine compounds, amide group-containing compounds, urea compounds, nitrogen-containing heterocyclic compounds, and the like.

Examples of the amine compounds include mono(cyclo)alkylamines; di(cyclo)alkylamines; tri(cyclo)alkylamines; substituted alkylaniline or derivatives thereof; ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis(1-(4-aminophenyl)-1-methylethyl)benzene, 1,3-bis(1-(4-aminophenyl)-1-methylethyl)benzene, bis(2-dimethylaminoethyl)ether, bis(2-diethylaminoethyl)ether, 1-(2-hydroxyethyl)-2-imidazolidinone, 2-quinoxalinol, N,N,N',N'-tetrakis(2-hydroxypropyl)ethylenediamine, N,N,N',N''N''-pentamethyldiethylenetriamine, and the like.

Examples of the amide group-containing compound include N-t-butoxycarbonyl group-containing amino compounds, formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl) isocyanurate, and the like.

Examples of the urea compounds include urea, methylurea, 1,1-dimethylurea, 1,3-dimethylurea, 1,1,3,3-tetramethylurea, 1,3-diphenylurea, tri-n-butylthiourea, and the like.

Examples of the nitrogen-containing heterocyclic compounds include imidazoles; pyridines; piperazines; pyrazine, pyrazole, pyridazine, quinoxaline, purine, pyrrolidine, piperidine, piperidine ethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, 1,4-diazabicyclo[2.2.2]octane, and the like.

In addition, the acid diffusion control agent may be a photodegradable base which is sensitized upon exposure to generate a weak acid. An example of the photodegradable base includes onium salt compounds which degrade upon the exposure and lose their acid diffusion controllability. Examples of the onium salt compounds include sulfonium salt compounds represented by the following formula (K1), and iodonium salt compounds represented by the following formula (K2).

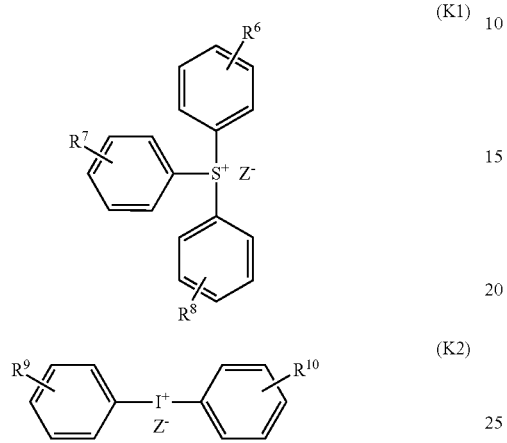

In the formula (K1) and the formula (K2), $R^6$ to $R^{10}$ each independently represent a hydrogen atom, an alkyl group, an alkoxy group, a hydroxyl group or a halogen atom; $Z^-$ represents an anion represented by $OH^-$, $R^{15}$—$COO^-$, $R^D$—$SO_2$—$N^-$—$R^{15}$, $R^{15}$—$SO_3^-$ or the following formula (K3), wherein $R^{15}$ represents a linear or branched alkyl group having 1 to 10 carbon atoms, a cycloalkyl group having 3 to 20 carbon atoms, an aryl group having 6 to 30 carbon atoms, or aralkyl group having 7 to 30 carbon atoms. A part or all of hydrogen atoms of the alkyl group, the cycloalkyl group, the aryl group and the aralkyl group are unsubstituted or substituted. $R^D$ represents a linear or branched alkyl group having 1 to 10 carbon atoms or a cycloalkyl group having 3 to 20 carbon atoms which does not have or has a substituent. A part or all of hydrogen atoms of the alkyl group and the cycloalkyl group are not substituted or substituted by a fluorine atom. However, provided that $Z^-$ represents $R^{15}$—$SO_3^-$, any case where a fluorine atom binds to the carbon atom to which $SO_3^-$ bonds is excluded.

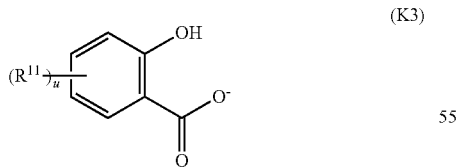

In the formula (K3), $R^{11}$ represents a linear or branched alkyl group having 1 to 12 carbon atoms, or a linear or branched alkoxyl group having 1 to 12 carbon atoms, wherein a part or all of hydrogen atoms included in the above alkyl group and alkoxyl group are not substituted or substituted by a fluorine atom; and u is an integer of 0 to 2.

Examples of the photodegradable base include compounds represented by the following formulae, and the like.

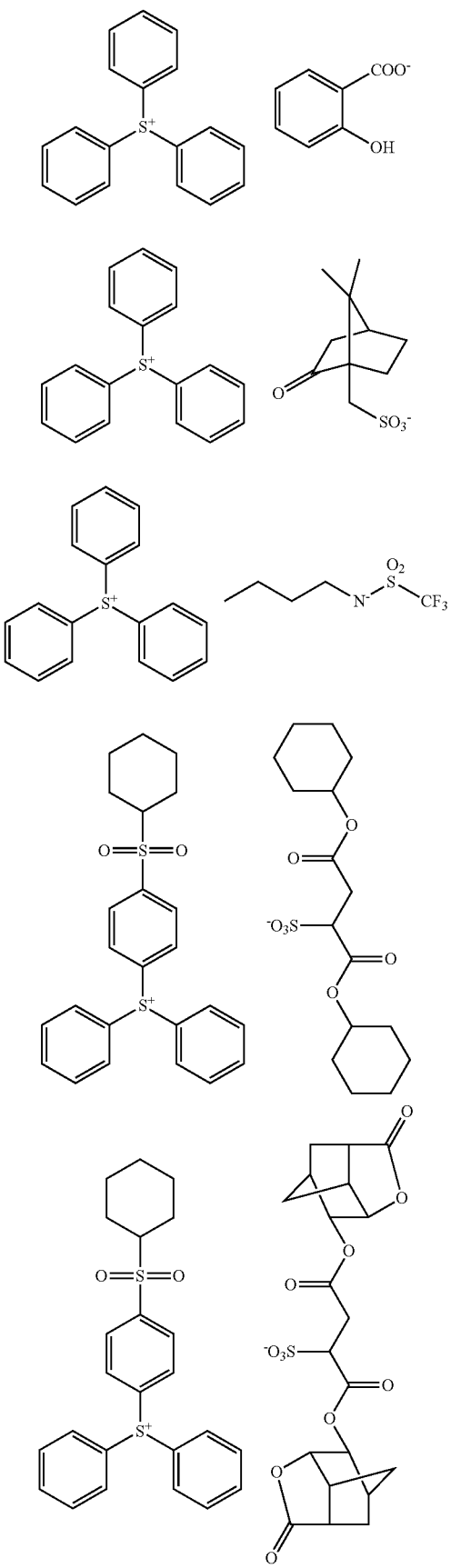

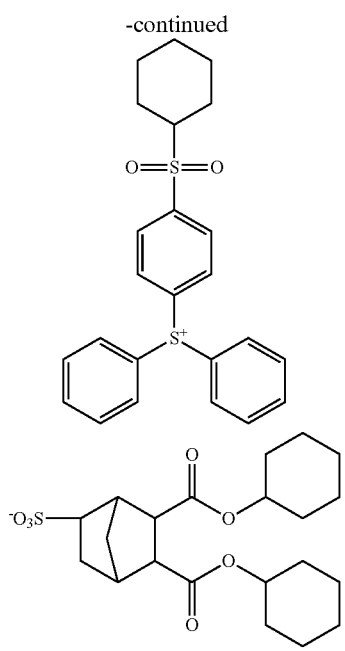

These acid diffusion controllers may be used alone, or in combination of two or more thereof. The content of the acid diffusion control agent is preferably no greater than 5 parts by mass with respect to 100 parts by mass of the polymer (A). When the content of the acid diffusion control agent used exceeds 5 parts by mass, the sensitivity for use as a resist tends to be deteriorated.

Surfactant

The surfactant is a component which has the effect of improving coating property, striation, developability and the like. Examples of the surfactant include nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, polyethylene glycol distearate, as well as commercially available products such as KP341 (manufactured by Shin-Etsu Chemical Co., Ltd.); POLY-FLOW No. 75, and No. 95 (each manufactured by Kyoeisha Chemical Co., Ltd.); F-top EF301, EF303, and EF352 (each manufactured by Tochem Products Co. Ltd.); Megafac F171, and F173 (each manufactured by Dainippon Ink And Chemicals, Incorporated); Fluorad FC430, and FC431 (each manufactured by Sumitomo 3M Ltd.); AsahiGuard BG710, Surflon S-382, SC-101, SC-102, SC-103, SC-104, SC-105, and SC-106 (each manufactured by Asahi Glass Co., Ltd.), and the like. These surfactants may be used either alone, or in combination of two or more thereof.

Alicyclic Skeleton-Containing Compound

The alicyclic skeleton-containing compound exerts the effect of improving dry-etching resistance, pattern configuration, adhesiveness to a substrate, and the like.

Examples of the alicyclic skeleton-containing compound include:

adamantane derivatives such as 1-adamantanecarboxylic acid, 2-adamantanone, and t-butyl 1-adamantanecarboxylate;

deoxycholic acid esters such as t-butyl deoxycholate, t-butoxycarbonylmethyl deoxycholate, and 2-ethoxyethyl deoxycholate;

lithocholic acid esters such as t-butyl lithocholate, t-butoxycarbonylmethyl lithocholate, and 2-ethoxyethyl lithocholate; and 3-[2-hydroxy-2,2-bis(trifluoromethyl)ethyl]tetracyclo[4.4.0.1$^{2,5}$.1$^{7,10}$]dodecane, 2-hydroxy-9-methoxycarbonyl-5-oxo-4-oxa-tricyclo[4.2.1.0$^{3,7}$]nonane, and the like. These alicyclic skeleton-containing compounds may be used either alone, or in combination of two or more thereof.

Sensitizing Agent

The sensitizing agent exhibits the action of increasing the amount of the acid generator (C) produced, and exerts the effect of improving "apparent sensitivity" of the composition.

Examples of the sensitizing agent include carbazoles, acetophenones, benzophenones, naphthalenes, phenols, biacetyls, eosins, rose bengals, pyrenes, anthracenes, phenothiazines, and the like. The sensitizing agent may be used either alone, or in combination of two or more thereof.

Preparation of Radiation-Sensitive Resin Composition

The radiation-sensitive resin composition may be prepared, for example, by mixing the polymer (A), the polymer (B), the acid generator (C), the solvent (D), and the compound (E), and the other optional components as required in a predetermined ratio. The total solid content of the radiation-sensitive resin composition is typically 0.1% by mass to 50% by mass, preferably 0.5% by mass to 30% by mass, and more preferably 1% by mass to 15% by mass.

EXAMPLES

Hereinafter, the present invention will be explained more specifically by way of Examples, but the present invention is not limited to these Examples. Measuring methods for each physical property are shown below.

Weight Average Molecular Weight (Mw) and Number Average Molecular Weight (Mn)

The Mw and the Mn of polymers were determined by using GPC columns (G2000HXL×2, G3000HXL×1, G4000HXL×1; manufactured by Tosoh Corporation) under the following analytical condition:

column temperature: 40° C.

elution solvent: tetrahydrofuran (manufactured by Wako Pure Chemical Industries, Ltd.)

flow rate: 1.0 mL/min sample concentration: 1.0% by mass sample injection amount: 100 μL detector: differential refractometer standard substance: mono-dispersed polystyrene $^{13}$C-NMR Analysis $^{13}$C-NMR analysis for determining the content of the structural units (mol %) and the content of fluorine atoms (% by mass) of the polymers was measured using a nuclear magnetic resonance apparatus (JNM-EX270 manufactured by JEOL, Ltd.).

Synthesis of Polymer

The monomers used for the synthesis of the polymer (A) and the polymer (B) are set forth below.

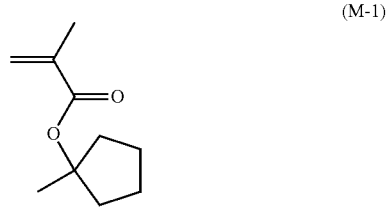

(M-1)

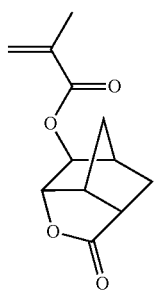
(M-2)

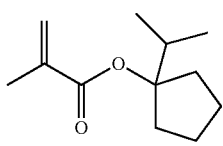
(M-3)

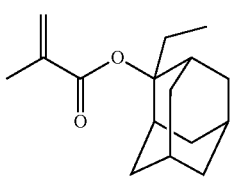
(M-4)

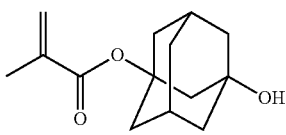
(M-5)

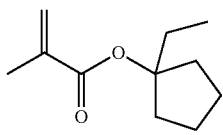
(M-6)

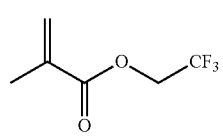
(M-7)

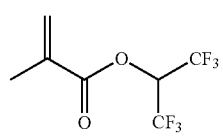
(M-8)

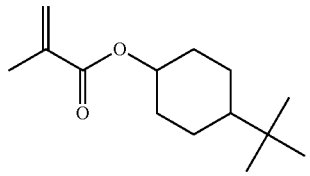
(M-9)

It is to be noted that the compounds (M-1), (M-3), (M-4) and (M-6) give the structural unit (I), the compound (M-2) gives the structural unit (II), and the compound (M-5) gives the other structural unit, respectively.

Synthesis of Polymer (A)

Synthesis Example 1

A monomer solution was prepared by dissolving 12.9 g (50 mol %) of the compound (M-1) and 17.1 g (50 mol %) of the compound (M-2) in 60 g of 2-butanone, and further adding 0.5 g of AIBN thereto. Then, a 200 mL three-necked flask containing 30 g of 2-butanone was purged with nitrogen for 30 min, and heated to 80° C. with stirring, and thereafter the monomer solution prepared above was added dropwise thereto via a dropping funnel over 3 hrs. The time of the start of the dropwise addition was considered to be the time of the initiation of the polymerization reaction, and the polymerization reaction was allowed to proceed for 6 hrs. After completion of the polymerization reaction, the polymerization solution was cooled to no greater than 30° C. via water-cooling, and poured into a 600 g of methanol to deposit a white powder, and the deposited white powder was filtered. The filtered white powder was washed twice by slurrying the white powder with 150 g of methanol, thereafter filtered again, and dried at 50° C. for 17 hrs to obtain the polymer (A-1) as a white powder (yield: 80%). The polymer (A-1) had an Mw of 13,000, and an Mw/Mn of 1.4. $^{13}$C-NMR analysis revealed that the content of the structural unit derived from the compound (M-1): the structural unit derived from the compound (M-2) in the polymer (A-1) was 50:50 (mol %).

Synthesis Examples 2 to 4

The polymers (A-2) to (A-4) were obtained in a similar manner to Synthesis Example 1 except that the monomers of the type specified in Table 1 below were used in the amount specified in Table 1. The content of each structural unit, Mw, Mw/Mn ratio, and yield (%) of each polymer obtained are collectively presented in Table 1.

TABLE 1

| | (A) Polymer | Monomer giving structural unit (I) | | | Monomer giving structural unit (II) | | | Monomer giving other structural unit | | | Mw | Mw/Mn | Yield (%) |
|---|---|---|---|---|---|---|---|---|---|---|---|---|---|
| | | type | amount used (mol %) | content of structural unit (mol %) | type | amount used (mol %) | content of structural unit (mol %) | type | amount used (mol %) | content of structural unit (mol %) | | | |
| Synthesis Example 1 | A-1 | M-1 | 50 | 50 | M-2 | 50 | 50 | — | — | — | 13,000 | 1.40 | 80 |
| Synthesis Example 2 | A-2 | M-3 | 50 | 50.5 | M-2 | 50 | 49.5 | — | — | — | 7,200 | 1.51 | 75 |
| Synthesis Example 3 | A-3 | M-1 | 40 | 39.5 | M-2 | 50 | 50.5 | — | — | — | 7,500 | 1.61 | 72 |
| | | M-4 | 10 | 10.5 | | | | | | | | | |
| Synthesis Example 4 | A-4 | M-3 | 40 | 40.5 | M-2 | 50 | 49.5 | M-5 | 10 | 10.0 | 7,550 | 1.62 | 68 |

Synthesis of Polymer (B)

Synthesis Example 5

A monomer solution was prepared by dissolving 8.5 g (30 mol %) of the compound (M-7) and 21.5 g (70 mol %) of the compound (M-6) in 60 g of 2-butanone, and further adding 1.38 g of AIBN thereto. Then, a 200 mL three-necked flask containing 30 g of 2-butanone was purged with nitrogen for 30 min, and heated to 80° C. with stirring, and thereafter the monomer solution prepared above was added dropwise thereto via a dropping funnel over 3 hrs. The time of the start of the dropwise addition was considered to be the time of the initiation of the polymerization reaction, and the polymerization reaction was allowed to proceed for 6 hrs. After completion of the polymerization reaction, the polymerization solution was cooled to no greater than 30° C. via water-cooling, and poured into a 600 g of methanol to deposit a white powder, and the deposited white powder was filtered. The filtered white powder was washed twice by slurrying the white powder with 150 g of methanol, thereafter filtered again, and dried at 50° C. for 12 hrs to obtain the polymer (B-1) as a white powder (yield: 89%). The polymer (B-1) had an Mw of 7,500, and an Mw/Mn of 1.4. $^{13}$C-NMR analysis revealed that the content of the structural unit derived from the compound (M-3): the structural unit derived from the compound (M-4) in the polymer (B-1) was 30:70 (mol %).

Synthesis Example 6

The polymer (B-2) was obtained in a similar manner to Synthesis Example 5 except that 7.96 g (20 mol %) of the compound (M-8) and 30.1 g (80 mol %) of the compound (M-9) were used as the monomer (yield: 68%). The polymer (B-2) had an Mw of 7,200, and an Mw/Mn of 1.51. $^{13}$C-NMR analysis revealed that the content of the structural unit derived from the compound (M-8): the structural unit derived from the compound (M-9) in the polymer (B-2) was 20.5:79.5 (mol %).

Preparation of Radiation-Sensitive Resin Composition

Each of other components constituting the radiation-sensitive resin composition than the polymer (A) and the polymer (B) as prepared in the above Synthesis Examples (the acid generator (C), the solvent (D), the compound (E) and the acid diffusion control agent (F)) is as follows.

(C) Acid Generator

C-1: triphenylsulfonium nonafluoro-n-butanesulfonate (the compound represented by the following formula (C-1))

C-2: 1-(4-n-butoxynaphthalen-1-yl)tetrahydrothiophenium nonafluoro-n-butanesulfonate (the compound represented by the following formula (C-2))

C-3: triphenylsulfonium 6-adamantyl carbonyloxy-1,1,2,2-tetrafluorohexane-1-sulfonate (the compound represented by the following formula (C-3))

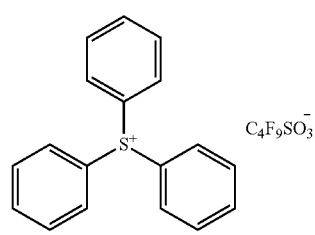

(C-1)

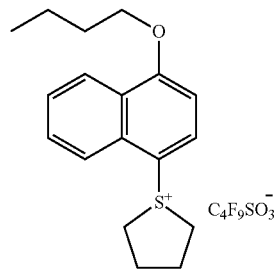

(C-2)

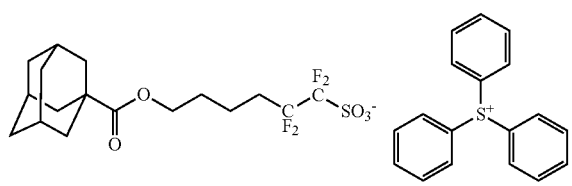

(C-3)

(D) Solvent

D-1: propylene glycol monomethyl ether acetate

The solvent (D-1) has a relative permittivity of 8 at 25° C., and a boiling point of 146° C. at 1 atm.

D-2: cyclohexanone

The solvent (D-2) has a relative permittivity of 18 at 25° C., and a boiling point of 156° C. at 1 atm.

Compound (E)

E-1: γ-butyrolactone (the compound represented by the following formula (E-1))

The compound (E-1) has a relative permittivity of 42 at 25° C., and a boiling point of 204° C. at 1 atm.

E-2: propylene carbonate (the compound represented by the following formula (E-2))

The compound (E-2) has a relative permittivity of 65 at 25° C., and a boiling point of 240° C. at 1 atm.

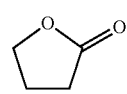

(E-1)

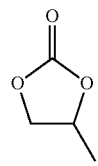

(E-2)

(F) Acid Diffusion Control Agent

F-1: N-t-butoxycarbonylpyrrolidine (the compound represented by the following formula (F-1))

F-2: triphenylsulfonium salicylate (the compound represented by the following formula (F-2))

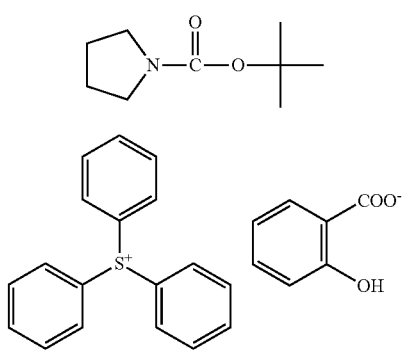

(F-1)

(F-2)

Example 1

A homogeneous solution was prepared by mixing 100 parts by mass of the polymer (A-1), 3 parts by mass of the polymer (B-1), 9.5 parts by mass of the acid generating agent (C-1), 2,010 parts by mass of the solvent (D-1) and 860 parts by mass of the solvent (D-2), 100 parts by mass of the compound (E-1), and 0.94 parts by mass of the acid diffusion control agent (F-1). Thereafter, the radiation-sensitive resin composition (J-1) according to Example 1 was prepared by filtering the homogeneous solution through a membrane filter with a pore size of 200 nm. The solid content (the total concentration of all components excluding the solvent) of the radiation-sensitive resin composition (J-1) was 5% by mass.

Examples 2 to 20 and Comparative Examples 1 to 3

The radiation-sensitive resin composition according to the respective Examples and Comparative Examples was prepared in a similar manner to Example 1 except that the type and amount of the respective components blended in Example 1 were replaced with those specified in Tables 2-1 and 2-2 below.

TABLE 2-1

| | Radiation-sensitive resin composition | (A) Polymer type | amount blended (parts by mass) | (B) Polymer type | amount blended (parts by mass) | (C) Acid generating agent type | amount blended (parts by mass) | (D) Solvent type | amount blended (parts by mass) | (E) Compound type | amount blended (parts by mass) | (F) Acid diffusion control agent type | amount blended (parts by mass) |
|---|---|---|---|---|---|---|---|---|---|---|---|---|---|
| Example 1  | J-1  | A-1 | 100 | B-1 | 3 | C-1 | 9.5 | D-1/D-2 | 2,010/860 | E-1 | 100 | F-1 | 0.94 |
| Example 2  | J-2  | A-1 | 100 | B-1 | 3 | C-1 | 9.5 | D-1/D-2 | 2,010/860 | E-1 | 50  | F-1 | 0.94 |
| Example 3  | J-3  | A-1 | 100 | B-1 | 3 | C-1 | 9.5 | D-1/D-2 | 2,010/860 | E-1 | 25  | F-1 | 0.94 |
| Example 4  | J-4  | A-1 | 100 | B-1 | 3 | C-1 | 9.5 | D-1/D-2 | 2,010/860 | E-2 | 100 | F-1 | 0.94 |
| Example 5  | J-5  | A-1 | 100 | B-1 | 3 | C-1 | 9.5 | D-1/D-2 | 2,010/860 | E-2 | 50  | F-1 | 0.94 |
| Example 6  | J-6  | A-1 | 100 | B-1 | 3 | C-1 | 9.5 | D-1/D-2 | 2,010/860 | E-2 | 25  | F-1 | 0.94 |
| Example 7  | J-7  | A-1 | 100 | B-1 | 3 | C-2 | 12  | D-1/D-2 | 2,010/860 | E-1 | 100 | F-1 | 0.94 |
| Example 8  | J-8  | A-1 | 100 | B-1 | 3 | C-2 | 12  | D-1/D-2 | 2,010/860 | E-1 | 50  | F-1 | 0.94 |
| Example 9  | J-9  | A-1 | 100 | B-1 | 3 | C-2 | 12  | D-1/D-2 | 2,010/860 | E-1 | 25  | F-1 | 0.94 |
| Example 10 | J-10 | A-1 | 100 | B-1 | 3 | C-2 | 12  | D-1/D-2 | 2,010/860 | E-2 | 100 | F-1 | 0.94 |
| Example 11 | J-11 | A-1 | 100 | B-1 | 3 | C-2 | 12  | D-1/D-2 | 2,010/860 | E-2 | 50  | F-1 | 0.94 |
| Example 12 | J-12 | A-1 | 100 | B-1 | 3 | C-2 | 12  | D-1/D-2 | 2,010/860 | E-2 | 25  | F-1 | 0.94 |
| Example 13 | J-13 | A-2 | 100 | B-1 | 3 | C-2 | 12  | D-1/D-2 | 2,010/860 | E-2 | 25  | F-1 | 0.94 |

TABLE 2-2

| | Radiation-sensitive resin composition | (A) Polymer type | amount blended (parts by mass) | (B) Polymer type | amount blended (parts by mass) | (C) Acid generating agent type | amount blended (parts by mass) | (D) Solvent type | amount blended (parts by mass) | (E) Compound type | amount blended (parts by mass) | (F) Acid diffusion control agent type | amount blended (parts by mass) |
|---|---|---|---|---|---|---|---|---|---|---|---|---|---|
| Example 14 | J-14 | A-3 | 100 | B-1 | 3 | C-2 | 12  | D-1/D-2 | 2,010/860 | E-2 | 25  | F-1 | 0.94 |
| Example 15 | J-15 | A-4 | 100 | B-1 | 3 | C-2 | 12  | D-1/D-2 | 2,010/860 | E-2 | 25  | F-1 | 0.94 |
| Example 16 | J-16 | A-1 | 100 | B-2 | 3 | C-2 | 12  | D-1/D-2 | 2,010/860 | E-2 | 25  | F-1 | 0.94 |
| Example 17 | J-17 | A-1 | 100 | B-1 | 3 | C-3 | 9.5 | D-1/D-2 | 2,010/860 | E-2 | 25  | F-2 | 1.5  |
| Example 18 | J-18 | A-1 | 100 | B-1 | 3 | C-3 | 9.5 | D-1/D-2 | 2,010/860 | E-2 | 25  | F-2 | 1.5  |
| Example 19 | J-19 | A-3 | 100 | B-2 | 3 | C-3 | 9.5 | D-1/D-2 | 2,010/860 | E-2 | 25  | F-2 | 1.5  |
| Example 20 | J-20 | A-4 | 100 | B-2 | 3 | C-3 | 9.5 | D-1/D-2 | 2,010/860 | E-2 | 25  | F-2 | 1.5  |
| Comparative Example 1 | j-1 | A-1 | 100 | B-1 | 3 | C-1 | 9.5 | D-1/D-2 | 2,010/860 | —   | —   | F-1 | 0.94 |
| Comparative Example 2 | j-2 | A-1 | 100 | B-1 | 3 | C-2 | 12  | D-1/D-2 | 2,010/860 | —   | —   | F-1 | 0.94 |
| Comparative Example 3 | j-3 | A-1 | 100 | B-1 | 3 | C-1 | 9.5 | D-1/D-2 | 2,010/860 | E-1 | 250 | F-1 | 0.94 |

Example 21

Formation of Resist Pattern

A coated film with a film thickness of 105 nm was provided on a 12-inch silicon wafer by spin-coating an underlayer antireflective film-forming composition (ARC66, manufactured by Brewer Science) on the 12-inch silicon wafer with a spin coater (CLEAN TRACK Lithius Pro i, manufactured by Tokyo Electron Limited), and thereafter subjecting the same to prebaking (PB) at 205° C. for 60 sec. Next, a resist film with a film thickness of 100 nm was provided by spin-coating the radiation-sensitive resin composition (J-1) obtained in Example 1 by means of the spin coater, and subjecting the same to PB at 90° C. for 60 sec, followed by cooling at 23° C. for 30 sec.

Subsequently, the resist film was exposed under the best focus conditions using an ArF immersion scanner ("NSR-S610C" manufactured by Nikon Precision Inc.) (NA: 1.3, quadrupole). In the exposure, the ArF Immersion Scanner was used to provide ¼ projection exposure; the size on the reticle was 192 nm chromium/384 nm pitch, and the mask bias was 0 nm. Thereafter, the exposed resist film was subjected to PEB on a hot plate of the spin coater at 105° C. for 60 sec, cooled at 23° C. for 30 sec, subjected to puddle development for 30 sec using methyl n-pentyl ketone as a developer solution, and rinsed with 4-methyl-2-pentanol for 7 sec. Spin-drying was conducted at 2,000 rpm for 15 sec, to form a 48 nm hole/96 nm pitch resist pattern.

Examples 22 to 40 and Comparative Examples 4 to 6

The resist pattern according to the respective Examples and Comparative Examples was formed in a similar manner to Example 21 except that the radiation-sensitive resin composition used in Example 21 was replaced with those specified in Tables 2-1 and 2-2 below.

Evaluations

The respective resist patterns formed in Examples 22 to 40 and Comparative Examples 4 to 6 were evaluated for missing contact hole formation suppressibility, sensitivity and static contact angle in accordance with the method described below. The evaluation results are shown in Table 3.

Missing Contact Hole Formation Suppressibility

The respective resist patterns formed in the above Examples and Comparative Examples were observed using a scanning electron microscope ("CG-4000", manufactured by Hitachi High-Technologies Corporation), to conduct line-width measurement. The missing contact hole formation suppressibility was evaluated by counting the number of the missing contact holes observed within a given field of view at a visual magnification of 50K. Smaller number of the missing contact holes was determined to be more favorable in terms of the missing contact hole suppressibility.

Sensitivity (mJ/cm$^2$)

An optimum dose at which a hole pattern having a diameter of 0.055 μm was formed by reduced projection exposure through an immersion liquid (water) and a mask having a dot pattern formed so that a hole pattern having a diameter of 0.055 μm was obtained, was taken as the sensitivity (mJ/cm$^2$). It is to be noted that the above-mentioned scanning electron microscope was used for the line-width measurement.

Static Contact Angle

A radiation-sensitive resin composition was first spin-coated on an 8-inch silicon wafer, and subjected to PB on a hot plate at 90° C. for 60 sec, whereby a coated film (photoresist film) having a film thickness of 100 nm was provided. Thereafter, the static contact angle was measured immediately in accordance with the following procedure using a contact angle measuring apparatus ("DSA-10", manufactured by KRUS) in an environment at a room temperature of 23° C., a humidity of 45% and an ordinary pressure.

A wafer stage position was adjusted in the contact angle measuring apparatus, and the above-mentioned wafer was set on the adjusted stage. Next, water was injected into a needle, and the position of the needle was fine-tuned to an initial position which allowed a water droplet to be formed on the wafer set as above. Thereafter, water was discharged from the needle at a rate of 9.8 μL/min, to form 6.5 μL of a water droplet on the wafer, and the needle was retracted from the water droplet.

Thereafter, the static contact angle was continuously measured 10 times at the same point over 4 sec, starting from 2 sec after the formation of the water droplet. This operation was conducted three times at different points where a water droplet was formed, and a total of 30 measurements were averaged to obtain a reading of the static contact angle.

TABLE 3

| | Radiation-sensitive resin composition | Number of missing contact holes | Sensitivity (mJ/cm$^2$) | Static contact angle (°) |
|---|---|---|---|---|
| Example 21 | J-1 | 0 | 18 | 88.6 |
| Example 22 | J-2 | 2 | 18 | 86.0 |
| Example 23 | J-3 | 8 | 17 | 83.3 |
| Example 24 | J-4 | 0 | 18 | 90.0 |
| Example 25 | J-5 | 0 | 17 | 88.8 |
| Example 26 | J-6 | 3 | 17 | 85.2 |
| Example 27 | J-7 | 0 | 21 | 88.7 |
| Example 28 | J-8 | 3 | 20 | 86.2 |
| Example 29 | J-9 | 10 | 20 | 83.7 |
| Example 30 | J-10 | 0 | 20 | 90.1 |
| Example 31 | J-11 | 0 | 19 | 89.0 |
| Example 32 | J-12 | 2 | 19 | 85.5 |
| Example 33 | J-13 | 4 | 20 | 86.2 |
| Example 34 | J-14 | 3 | 20 | 86.0 |
| Example 35 | J-15 | 2 | 19 | 85.8 |
| Example 36 | J-16 | 2 | 18 | 86.5 |
| Example 37 | J-17 | 6 | 17 | 86.6 |
| Example 38 | J-18 | 7 | 16 | 87.5 |
| Example 39 | J-19 | 7 | 16 | 88.5 |
| Example 40 | J-20 | 4 | 14 | 87.5 |
| Comparative Example 4 | j-1 | 15 | 17 | 77.9 |
| Comparative Example 5 | j-2 | 17 | 19 | 78.4 |
| Comparative Example 6 | j-3 | 16 | 19 | 90.1 |

From the results shown in Table 3, it is revealed that by using the resist pattern-forming method and radiation-sensitive resin composition according to the embodiment of the present invention, the formation of missing contact holes can be suppressed.

According to the embodiment of the present invention, a resist pattern-forming method and a radiation-sensitive resin composition can be provided which are suitable for liquid immersion lithography processes, leading to superior lithography characteristics such as suppression of the formation of missing contact holes in the case of using a developer solution containing an organic solvent.

Obviously, numerous modifications and variations of the present invention are possible in light of the above teachings. It is therefore to be understood that within the scope of the appended claims, the invention may be practiced otherwise than as specifically described herein.

What is claimed is:

1. A resist pattern-forming method comprising:

coating a radiation-sensitive resin composition on a substrate to provide a resist film;

exposing the resist film; and developing the exposed resist film with a developer solution comprising no less than 80% by mass of an organic solvent, the radiation-sensitive resin composition comprising:

a base polymer having an acid-labile group;

a fluorine-atom-containing polymer having a content of fluorine atoms higher than a content of fluorine atoms of the base polymer;

a radiation-sensitive acid generator;

a solvent; and a compound having a relative permittivity greater than a relative permittivity of the solvent by at least 15, a content of the compound being no less than 10 parts by mass and no greater than 200 parts by mass with respect to 100 parts by mass of the base polymer, and the base polymer having a structural unit represented by a formula (I):

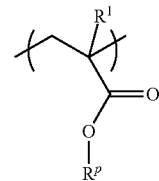

(1)

wherein, in the formula (I), $R^1$ represents a hydrogen atom, a fluorine atom, a methyl group or a trifluoromethyl group; and $R^p$ represents an acid-labile group.

2. The resist pattern-forming method according to claim 1, wherein the compound has a relative permittivity of no less than 20 and no greater than 75.

3. The resist pattern-forming method according to claim 1, wherein the compound has a boiling point of no less than 180° C. and no greater than 300° C. at 1 atm.

4. The resist pattern-forming method according to claim 1, wherein the compound is a lactone compound, a cyclic carbonate compound, or a combination thereof.

5. The resist pattern-forming method according to claim 1, wherein the acid-labile group of the base polymer comprises a monocyclic or polycyclic alicyclic hydrocarbon group.

* * * * *